(12) United States Patent
Cok

(10) Patent No.: US 7,635,609 B2
(45) Date of Patent: *Dec. 22, 2009

(54) PATTERNING METHOD FOR LIGHT-EMITTING DEVICES

(75) Inventor: Ronald S. Cok, Rochester, NY (US)

(73) Assignee: Eastman Kodak Company, Rochester, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 11/735,539

(22) Filed: Apr. 16, 2007

(65) Prior Publication Data

US 2008/0254555 A1  Oct. 16, 2008

(51) Int. Cl.
  *H01L 51/40* (2006.01)
(52) U.S. Cl. ............... 438/99; 438/22; 438/671; 257/E33.001
(58) Field of Classification Search .......... 438/99, 438/22, 671, 759; 257/E21.024, E21.037, 257/E21.058, E33.001
See application file for complete search history.

(56) References Cited

U.S. PATENT DOCUMENTS

| | | | |
|---|---|---|---|
| 4,476,292 A | 10/1984 | Ham et al. | |
| 4,769,292 A | 9/1988 | Tang et al. | |
| 5,247,190 A | 9/1993 | Friend et al. | |
| 5,522,963 A | 6/1996 | Anders, Jr. et al. | |
| 6,392,340 B2 | 5/2002 | Yoneda et al. | |
| 6,703,298 B2 | 3/2004 | Roizin et al. | |
| 7,049,159 B2 * | 5/2006 | Lowery | 438/22 |
| 7,135,385 B1 * | 11/2006 | Patwardhan et al. | 438/464 |
| 2005/0233072 A1 * | 10/2005 | Stephan et al. | 427/207.1 |
| 2006/0183029 A1 | 8/2006 | Klauk et al. | |
| 2006/0283539 A1 | 12/2006 | Slafer et al. | |

FOREIGN PATENT DOCUMENTS

| | | |
|---|---|---|
| DE | 36 31 383 | 3/1988 |
| WO | 99/54786 | 10/1999 |
| WO | WO 2004/036663 A2 * | 4/2004 |
| WO | 2006/111766 | 10/2006 |

OTHER PUBLICATIONS

Tang et al, "Organic Electroluminescent Diodes", Applied Physics Letter 51, Sep. 21, 1987, pp. 913-915.
Tang et al., "Electroluminescence of Doped Organic Thin Films", Journal of Applied Physics 65, May 1, 1989, pp. 3610-3616.

* cited by examiner

*Primary Examiner*—Asok K Sarkar
*Assistant Examiner*—Julia Slutsker
(74) *Attorney, Agent, or Firm*—Stephen H. Shaw; Raymond L. Owens

(57) ABSTRACT

A method of patterning a substrate that includes mechanically locating a first masking film over the substrate; segmenting the first masking film into a first masking portion and first contiguous opening portions in first locations; mechanically removing the one or more first contiguous opening portions; depositing first materials over the substrate in the first locations to form first patterned areas; mechanically locating a second masking film over the substrate and first masking portions; segmenting the second masking film and first masking portion into a second masking portion and second contiguous opening portions, wherein the second contiguous opening portions are in second locations over the substrate, yet different from the first locations; mechanically removing the second contiguous opening portions; and depositing second materials over the substrate in the second locations to form second patterned areas.

20 Claims, 22 Drawing Sheets ent electrode layer. Light generated from such an alternative device may be emitted through the top transparent electrode. This is commonly referred to as a top-emitting device.

PATTERNING METHOD FOR LIGHT-EMITTING DEVICES

FIELD OF THE INVENTION

The present invention relates to light-emitting devices, and more particularly to a method for depositing in a pattern over a substrate.

BACKGROUND OF THE INVENTION

Organic light-emitting diodes (OLEDs) are a promising technology for flat-panel displays and area illumination lamps. The technology relies upon thin-film layers of organic materials coated upon a substrate. OLED devices generally can have two formats known as small-molecule devices such as disclosed in U.S. Pat. No. 4,476,292, issued Oct. 9, 1984, by Ham et al., and polymer-OLED devices such as disclosed in U.S. Pat. No. 5,247,190, issued Sep. 21, 1993, by Friend et al. Either type of OLED device may include, in sequence, an anode, an organic electroluminescent (EL) element, and a cathode. The organic EL element disposed between the anode and the cathode commonly includes an organic hole-transporting layer (HTL), an emissive layer (EML) and an organic electron-transporting layer (ETL). Holes and electrons recombine and emit light in the EML layer. Tang et al. (Applied Physics Letter, 51, 913 (1987), Journal of Applied Physics, 65, 3610 (1989), and U.S. Pat. No. 4,769,292, issued Sep. 6, 1988) demonstrated highly efficient OLEDs using such a layer structure. Since then, numerous OLEDs with alternative layer structures, including polymeric materials, have been disclosed and device performance has been improved. The use of inorganic light-emitting materials, for example quantum dot particles, is also known in the art.

Light is generated in an OLED device when electrons and holes that are injected from the cathode and anode, respectively, flow through the electron transport layer and the hole transport layer and recombine in the emissive layer. Many factors determine the efficiency of this light generating process. For example, the selection of anode and cathode materials can determine how efficiently the electrons and holes are injected into the device; the selection of ETL and HTL can determine how efficiently the electrons and holes are transported in the device, and the selection of EML can determine how efficiently the electrons and holes are recombined and emit light.

A typical OLED device uses a glass substrate, a transparent conducting anode such as indium-tin-oxide (ITO), a stack of organic layers, and a reflective cathode layer. Light generated from such a device may be emitted through the glass substrate. This is commonly referred to as a bottom-emitting device. Alternatively, a device can include a substrate, a reflective anode, a stack of organic layers, and a top transparent electrode layer. Light generated from such an alternative device may be emitted through the top transparent electrode. This is commonly referred to as a top-emitting device.

LED devices can employ a variety of light-emitting organic materials patterned over a substrate that emit light of a variety of different frequencies, for example red, green, and blue, to create a full-color display. For small molecule organic materials, such patterned deposition is done by evaporating materials and is quite difficult, requiring, for example, expensive metal shadow-masks. Each mask is unique to each pattern and device design. These masks are difficult to fabricate and must be cleaned and replaced frequently. Material deposited on the mask in prior manufacturing cycles may flake off and cause particulate contamination. Moreover, aligning shadow-masks with a substrate is problematic and often damages the materials already deposited on the substrate. Further, the masks are subject to thermal expansion during the OLED material deposition process, reducing the deposition precision and limiting the resolution and size at which the pattern may be formed. Polymer LED materials may be deposited in liquid form and patterned using expensive photolithographic techniques.

Alternatively, skilled practitioners employ a combination of emitters, or an unpatterned broad-band emitter, to emit white light together with patterned color filters, for example, red, green, and blue, to create a full-color display. The color filters may be located on the substrate, for a bottom-emitter, or on the cover, for a top-emitter. For example, U.S. Pat. No. 6,392,340 entitled "Color Display Apparatus Having Electroluminescence Elements" issued May 21, 2002, by Yoneda et al., illustrates such a device. However, such designs are relatively inefficient since approximately two-thirds of the light emitted may be absorbed by the color filters.

The use of polymer, rather than metal, masks is known in the prior art. For example, WO2006/111766, published Oct. 26, 2006, by Speakman et al., describes a method of manufacturing, comprising applying a mask to a substrate; forming a pattern in the mask; processing the substrate according to the pattern; and mechanically removing the mask from the substrate. A method of manufacturing an integrated circuit is also disclosed. However, this method creates significant particulate contamination that can deleteriously affect subsequent processing steps, for example, the deposition of materials or encapsulation of a device. Moreover, subsequent location of a mask over a previously patterned area may damage materials in the previously patterned area.

Patterning a flexible substrate within a roll-to-roll manufacturing environment is also known and described in US2006/0283539, published Dec. 21, 2006, by Slafer et al. However, such a method is not readily employed with multiple patterned substrates employing evaporated deposition. Disposable masks are also disclosed in U.S. Pat. No. 5,522, 963, issued Jun. 4, 1996, by Anders, Jr. et al., and a process of laminating a mask to a ceramic substrate is also described. However, a teaching of registering a mask to the substrate is limited in registration and size. A self-aligned process is described in U.S. Pat. No. 6,703,298, issued Mar. 9, 2004, by Roizin et al., for making memory cells. A sputtered disposable mask is patterned and removed by etching. However, as with the prior-art disclosures cited above, the formation of the patterned mask by employing multiple masking, deposition, and processing steps, are not compatible with delicate, especially organic, materials such as are found in OLED displays.

There is a need, therefore, for an improved method for patterning materials over a substrate that improves resolution and efficiency, reduces damage to underlying layers, reduces particulate contamination, scales to large-size substrates, and reduces manufacturing costs.

SUMMARY OF THE INVENTION

The aforementioned need is met in accordance with one embodiment of the present invention that provides a method of patterning a substrate. The method includes several steps:

a) mechanically locating a first masking film over the substrate;

b) segmenting the first masking film into a first masking portion and one or more first contiguous opening portions in first locations;

c) mechanically removing the one or more first contiguous opening portions;

d) depositing first materials over the substrate in the first locations to form first patterned areas;

e) mechanically locating a second masking film over the substrate and first masking portions;

f) segmenting the second masking film and first masking portion into a second masking portion and one or more second contiguous opening portions, wherein the second contiguous opening portions are in one or more second locations over the substrate, yet different from the first locations;

g) mechanically removing the one or more second contiguous opening portions; and h) depositing second materials over the substrate in the second locations to form second patterned areas.

Advantages

The method of the present invention has the advantage that it improves resolution and efficiency, reduces damage to underlying layers, reduces particulate contamination, scales to large-size substrates, and reduces manufacturing costs for a patterned device formed on a substrate.

It will be understood that the figures are not to scale since the individual components have too great a range of sizes and thicknesses to permit depiction to scale.

DETAILED DESCRIPTION OF THE INVENTION

Figure 1:
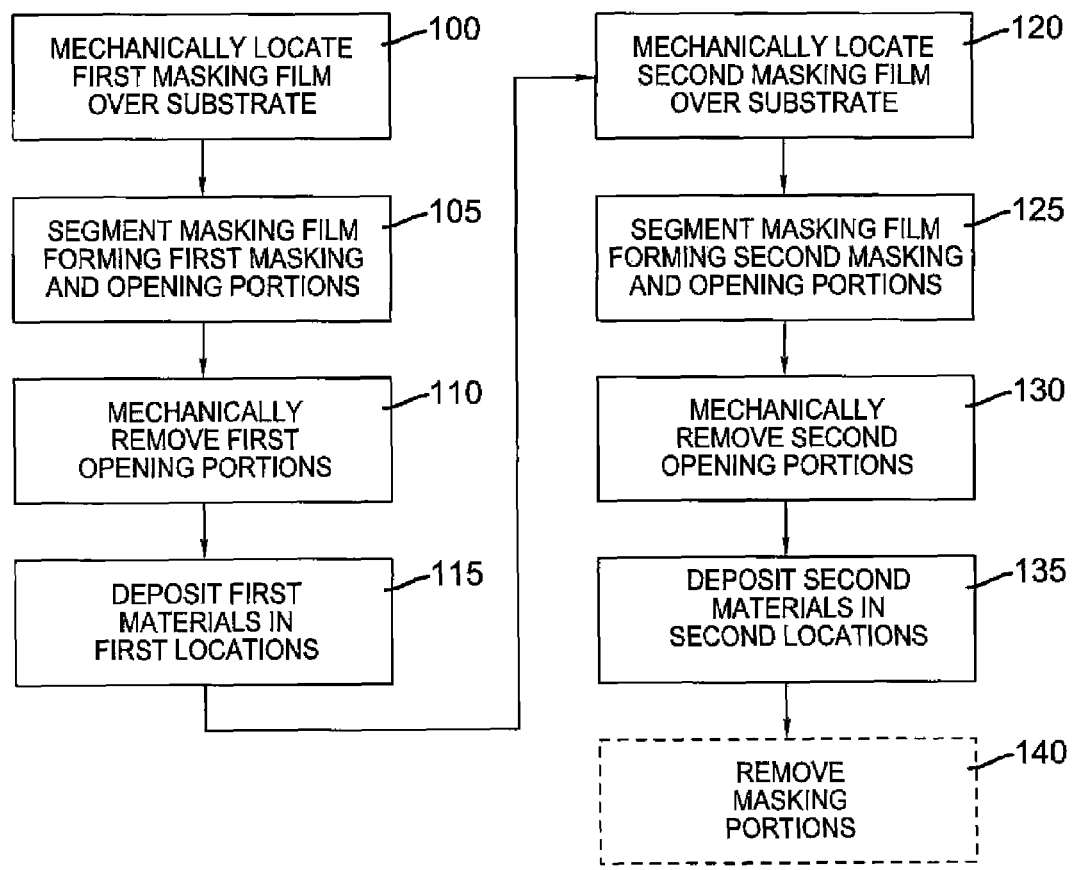
FIG. 1 is a flow chart illustrating a method of forming a patterned, device according to one embodiment of the present invention.

Referring to FIG. 1, in accordance with one embodiment of the present invention, a method of patterning a substrate comprises the steps of mechanically locating 100 a first masking film over a substrate, segmenting 105 the first masking film into a first masking portion and one or more first contiguous opening portions in first locations, mechanically removing 110 the one or more first contiguous opening portions, depositing 115 first materials over the substrate in the first locations to form first patterned areas. A second masking film is mechanically located 120 over the substrate and first masking portion, and segmented 125 into a second masking portion and one or more second contiguous opening portions in second locations. The second contiguous opening portions are in one or more second locations over the substrate, yet different from the first locations. By locating the second contiguous opening portions in different locations from the first, different portions of the substrate are exposed and different materials may be deposited thereon; thereby, patterning the substrate with different materials in different locations. The locations may be determined from the design and application for which the substrate is intended. For example, a cell phone display device will have pixel areas according to one design and flat panel television will have pixel areas according to a different design. The one or more second contiguous opening portions are mechanically removed 130, and second materials deposited 135 over the substrate in the second locations. In an optional step, the first and second masking portions are removed 140 after the second materials are deposited.

In a further embodiment of the present invention, the steps of mechanically locating a third masking film over the substrate and second masking portions, segmenting the third masking film and second masking portion into a third masking portion and one or more third contiguous opening portions, wherein the third contiguous opening portions are in one or more third locations over the substrate different from the first and second locations, mechanically removing the one or more third contiguous opening portions, and depositing third materials over the substrate in the third locations to form third patterned areas may be employed and are similar to the steps 120 through 135. In an optional step, the first, second, and third masking portions are all removed after the third materials are deposited. Such steps may be repeated to provide patterned material deposition over any number of locations on the substrate.

Figure 6:
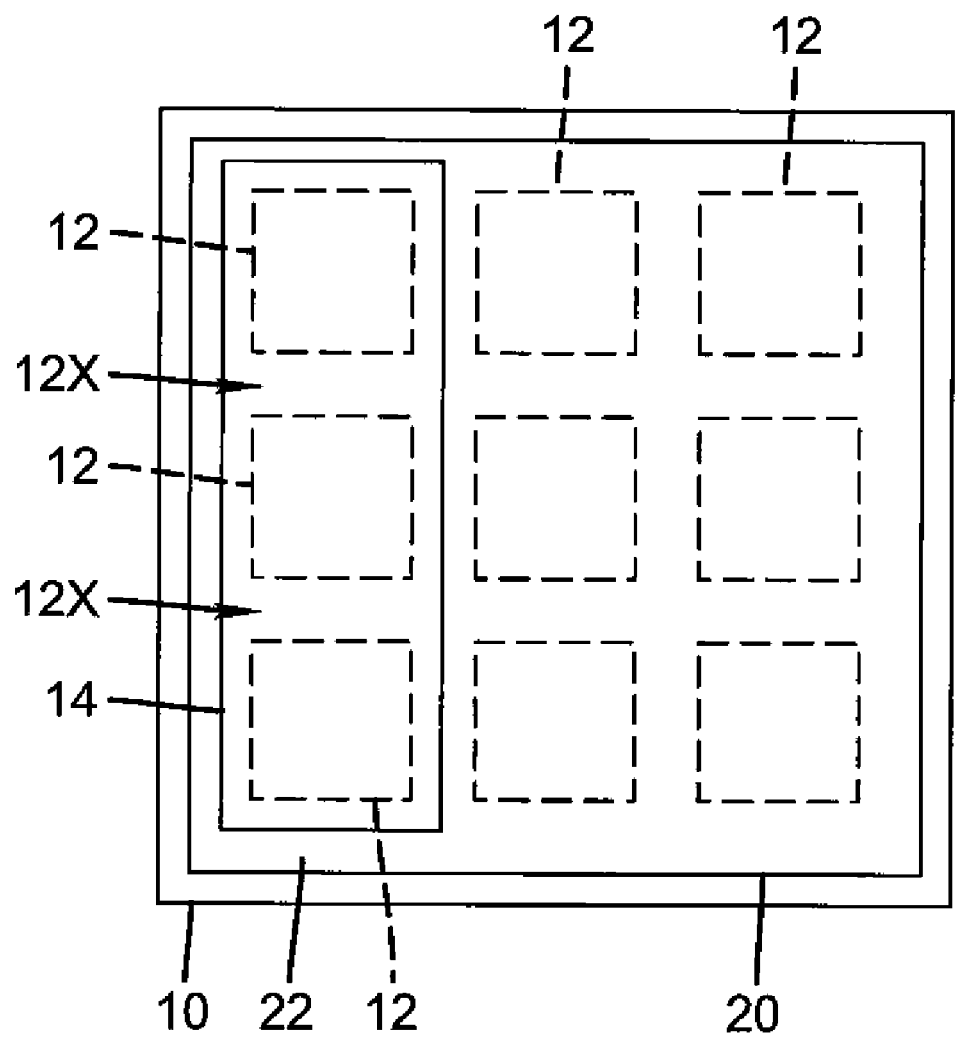
FIG. 6 is a top view of contiguous areas over a substrate according to an embodiment of the present invention.

The present invention may be employed to pattern a substrate and form distinct operable areas, for example, light-emitting pixels in a display. The materials may be light-emitting materials. For example, organic materials such as small molecule or polymer materials, or inorganic materials such as phosphorescent materials or quantum dots may be used as light-emitting materials. According to the present invention, a contiguous opening portion of a masking film is a single opening or hole in the masking film over two or more different, non-contiguous operable areas. For example, such operable areas are operable to emit light and are separated by inoperable areas that do not emit light. Referring to FIG. 6, for example, display devices typically have a plurality of light-emitting elements having light-emitting areas 12 located over different locations on a substrate 10. A contiguous opening portion 14 in a masking film 20, according to the present invention, is a contiguous opening in the masking film 20 that covers at least two different operable, light-emitting areas 12 separated by inoperable non-light emitting areas 12X. The remainder of the masking film 20 comprises the masking portion 22 of the masking film 20. Since the light-emitting areas 12 are typically not themselves contiguous, the contiguous opening portions 14 will typically also cover a portion 12X of the substrate 10 that is not light-emitting.

The masking films 20 employed in multiple different deposition steps may be identical. However, in most embodiments of the present invention, the contiguous opening portions 14 in the masking film 20 may be formed in different locations so that different materials and elements may be deposited in different locations over the substrate 10. Moreover, more than one material may be deposited through the contiguous opening portions, as may other materials deposited in layers over the same location on the substrate 10. For example, the materials may comprise a plurality of light-emitting materials in light-emitting layers. The light-emitting materials may be organic materials comprising a small-molecule or polymer molecule light-emitting diodes. Alternatively, the light-emitting materials may be inorganic and comprise, for example, quantum dots. Other layers may comprise charge-control layers such as, for example, hole-injection, hole-transport, hole-blocking, electron-injection, electron-blocking, and electron-transport layers, as well as buffer layers. Optically active materials, for example light-scattering materials may be deposited.

According to various embodiments of the present invention, the opening portions of the mask film allow the deposition of materials into the exposed locations. At the same time, the masking portions of the mask film protect the remainder of the area over the substrate from undesirable deposition and particulate contamination caused by the segmenting of the masking film. Deposition of material into the exposed locations includes evaporating, inkjet, spray coating, slide coating, hopper coating, or curtain coating materials over the substrate in the exposed locations.

Figure 4:
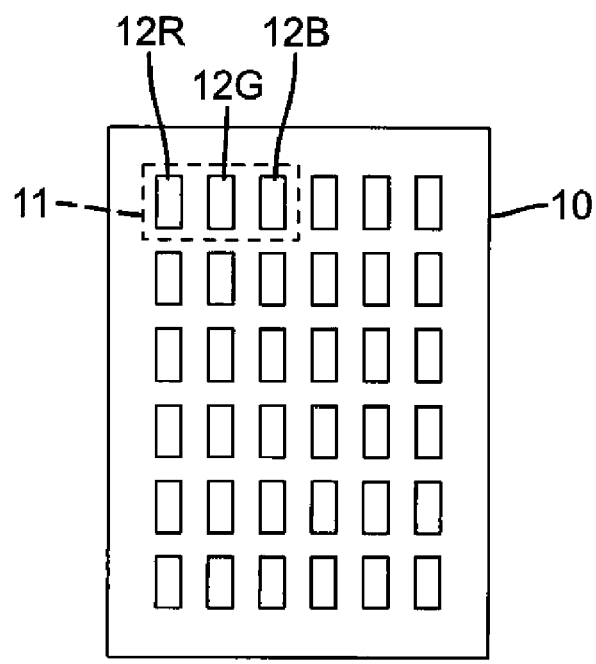
FIG. 4 is a top view of a three-color pixel stripe layout on a substrate according to the prior art.

Referring to FIG. 4, in a prior-art design, pixels 11 may comprise three, patterned, light-emitting areas 12R, 12G, 12B, each patterned light-emitting area 12 comprising a sub-pixel emitting light of a different color, for example red, green, and blue, to form a full-color display. In other designs, four-color pixels are employed, for example including a fourth white, yellow, or cyan light-emitting area. The present invention includes any patterned light-emitting device.

As shown in FIG. 4, the light-emitting elements 12R, 12G, 12B are arranged in a stripe configuration such that each color of light-emitting area forms a column of light-emitting areas emitting the same color of light. Alternatively, four-element pixels may be arranged in two-by-two groups of four light-emitting elements (not shown). All of these different designs and layouts may be formed by the method of the present invention, regardless of design, layout, or number of light-emitting areas per pixel or colors of light-emitting areas and specifically includes displays having red, green, and blue sub-pixels and displays having red, green, blue, and white sub-pixels.

As taught in the prior art, for example, in manufacturing light-emitting devices, deposition masks may be made of metal and are reused multiple times for depositing evaporated organic materials. The masks may be cleaned but are, in any event, expensive, subject to thermal expansion, difficult to align, and problematic to clean. Moreover, the masks eventually wear out.

The present invention does not employ photolithographic methods of liquid coating, drying, patterned exposure forming cured and uncured areas, followed by a liquid chemical removal of the cured or uncured areas to form a pattern. In contrast, the present invention provides a very low-cost, single-use mask that is patterned while in place over the substrate, thereby overcoming the limitations of the prior art. The masks may be formed of flexible thin films of, for example, polymers, either transparent or non-transparent and may be patterned in a completely dry environment, that is, no liquid chemicals must be employed.

Figure 2A:
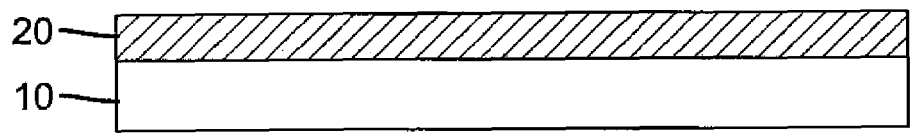
FIGS. 2A-2J are sequential side views of the construction of a patterned substrate according to an embodiment of the present invention.
Figure 2B:
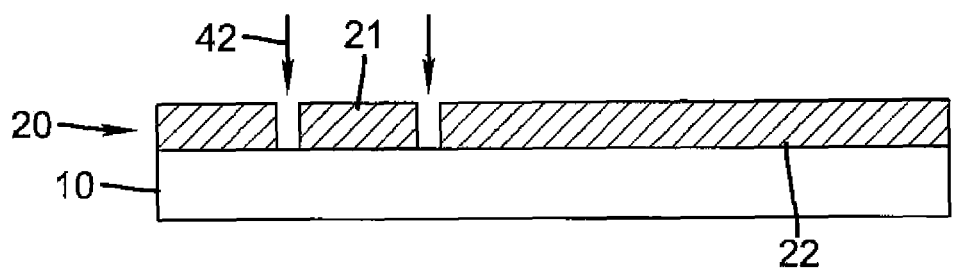
Figure 2C:
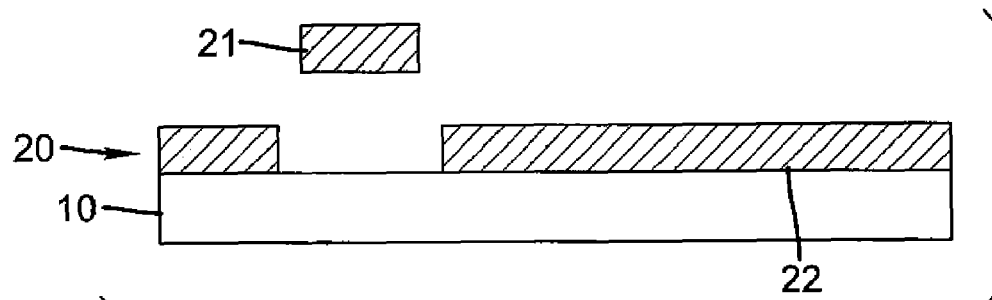
Figure 2D:
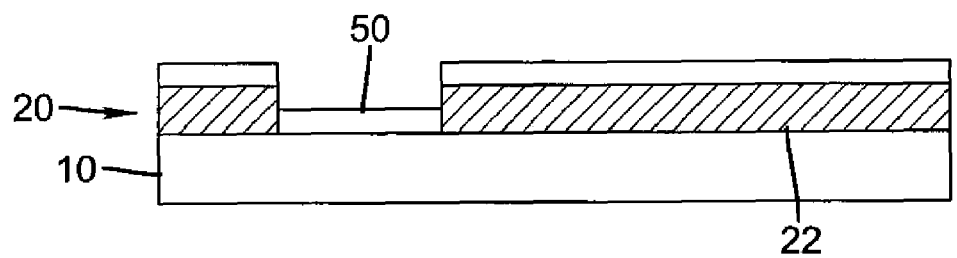
Figure 2E:
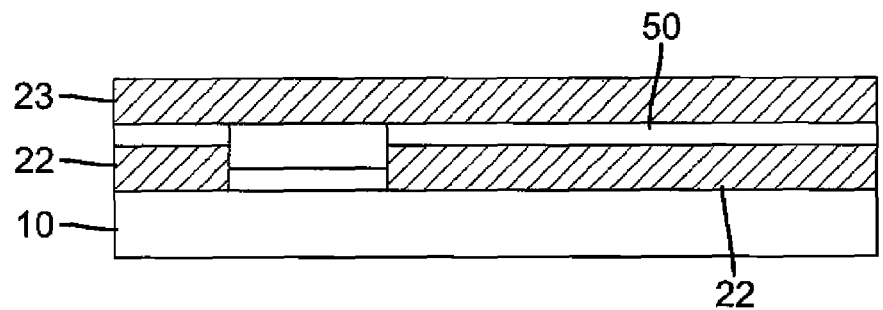
Figure 2F:
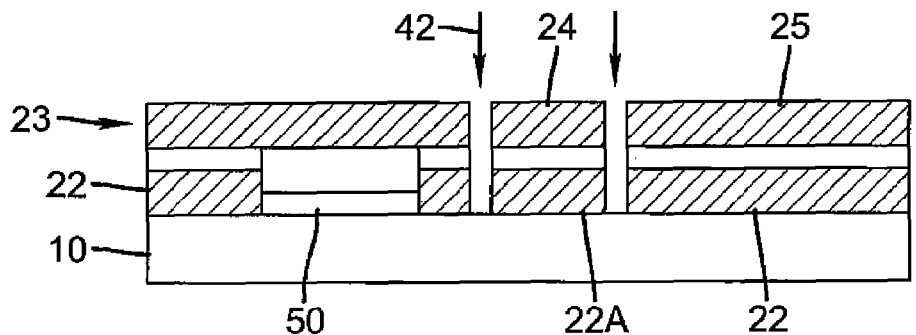
Figure 2G:
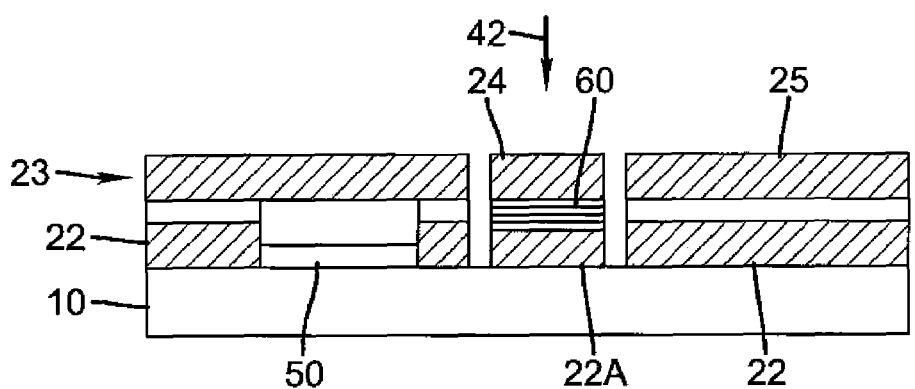
Figure 2H:
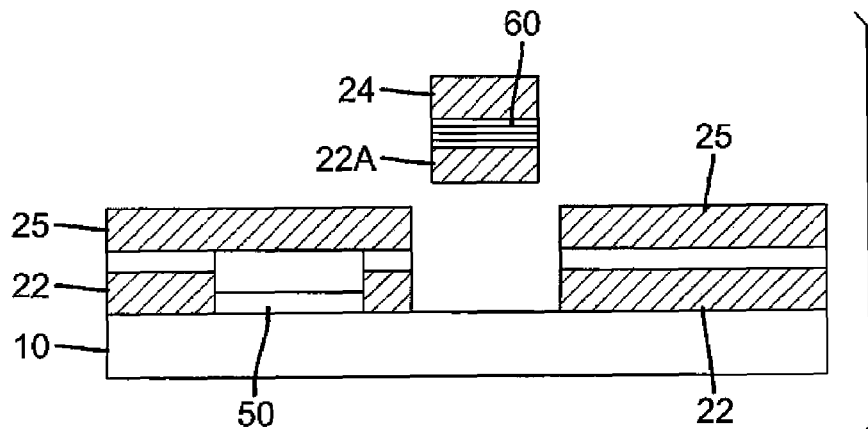
Figure 2I:
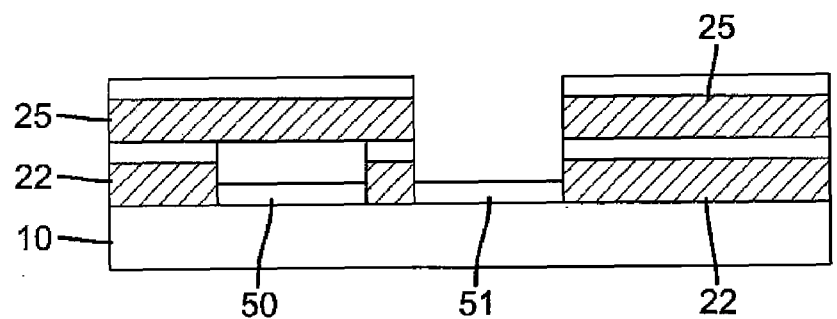

Referring to FIGS. 2A-2J, in one embodiment of the method of the present invention, two masks are successively employed. Each mask has one or more contiguous opening portions in different locations that are referred to as "mask holes". Throughout this patent application "mask holes" and "contiguous opening portions" in the mask are used interchangeably. Two different types of material are deposited through the mask holes in two different sets of locations corresponding to different locations over the substrate. In this embodiment, a first masking film 20 is firstly located over the substrate (FIG. 2A) and segmented (FIG. 2B) into a first masking portion 22 and a first contiguous opening portion (mask hole) 21. Segmentation may be performed, for example, by laser ablation. The contiguous opening portion 21 is removed (FIG. 2C). First material 50 is then deposited (FIG. 2D) through the mask holes onto the corresponding substrate locations. In a second series of steps, a second masking film 23 is secondly located over the substrate 10 and first mask portions 22 (FIG. 2E) and segmented (FIG. 2F) into a second masking portion 25 and second opening portion 24 corresponding to second locations. Note that both the second masking film 23 and the first mask portion 22A may be segmented at the same time. A pattern-wise controllable adhesive 60 may be coated on either the top side of the first masking film 20 or the bottom side of the second masking film 23 and activated by heat or exposure to radiation, for example by employing a beam of light (FIG. 2G). To assist in such activation, the masking film 20 may be transparent and the controllable adhesive 60 may be light absorbing. The first masking portion 22A and the second opening portion 24 are then mechanically removed (FIG. 2H) and then a layer of second materials 51 deposited (FIG. 2I) over the substrate 10 in the second locations corresponding to the second opening portions 24. The first and second masking portion 22 and 25, respectively, may then be mechanically removed (FIG. 2J), leaving a patterned substrate 10.

Examples of controllable adhesives are thermosetting adhesives that are not tacky at ambient temperature, but which become tacky as they are heated with infrared radiation; hot-melt adhesives that may be activated by infrared radiation; and ultra-violet or visible light curing adhesives. A specific example of a suitable adhesive film would be the B-staged adhesive films from TechFilm® that can be activated by radiation from an IR laser.

Figure 2J:
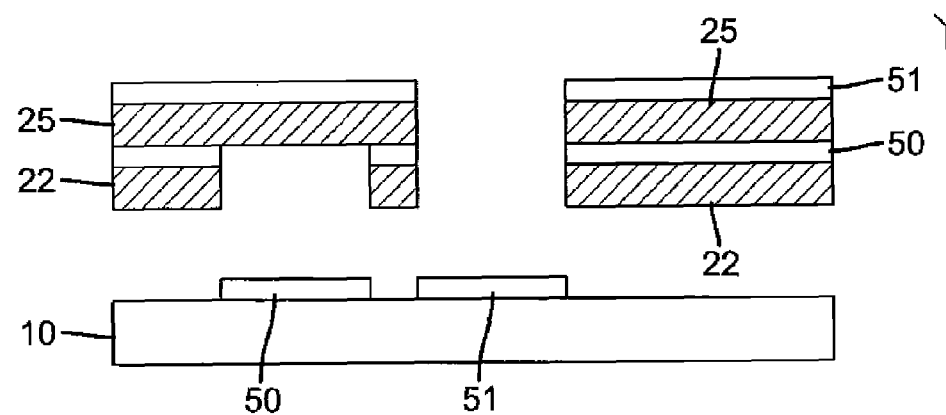
Figure 3A:
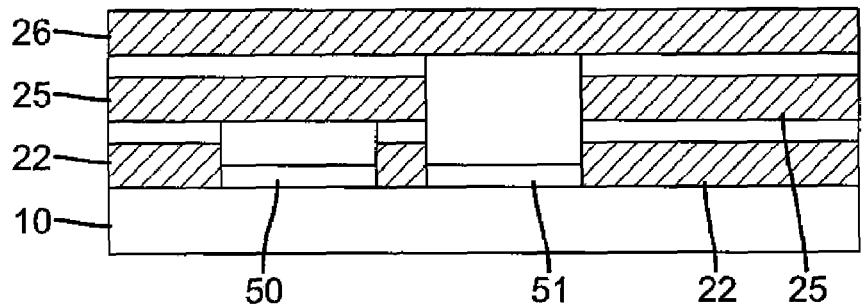
FIGS. 3A-3F are sequential side views of the construction of a patterned substrate according to an alternative embodiment of the present invention.
Figure 3B:
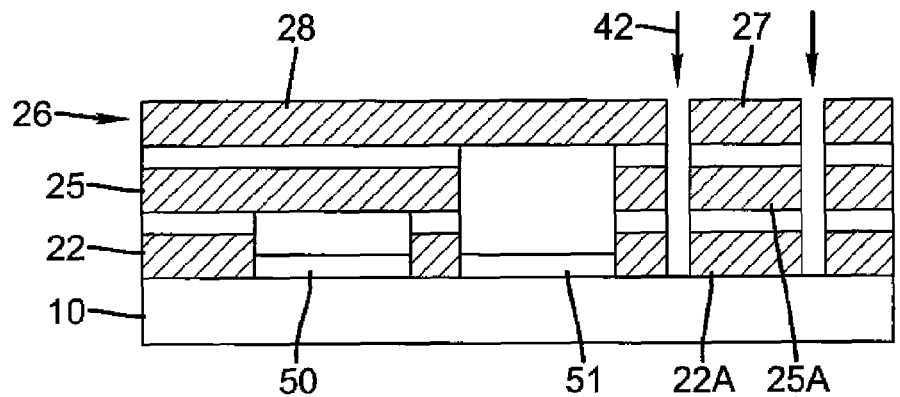
Figure 3C:
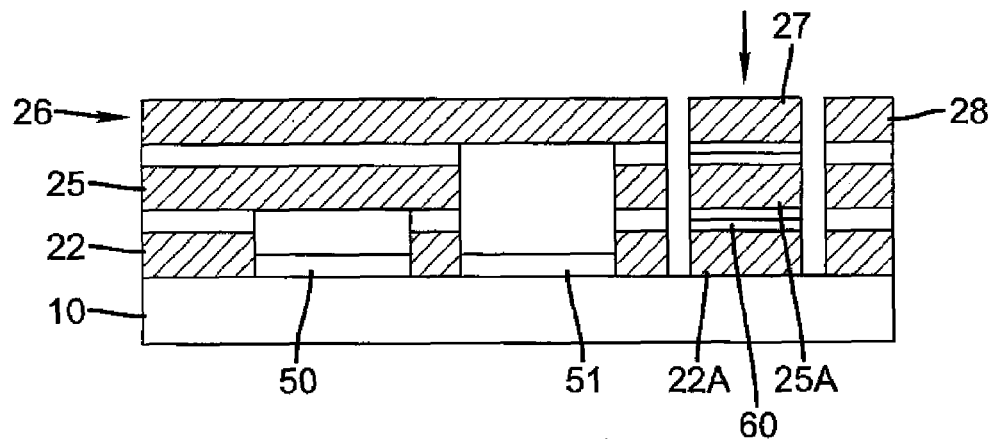
Figure 3D:
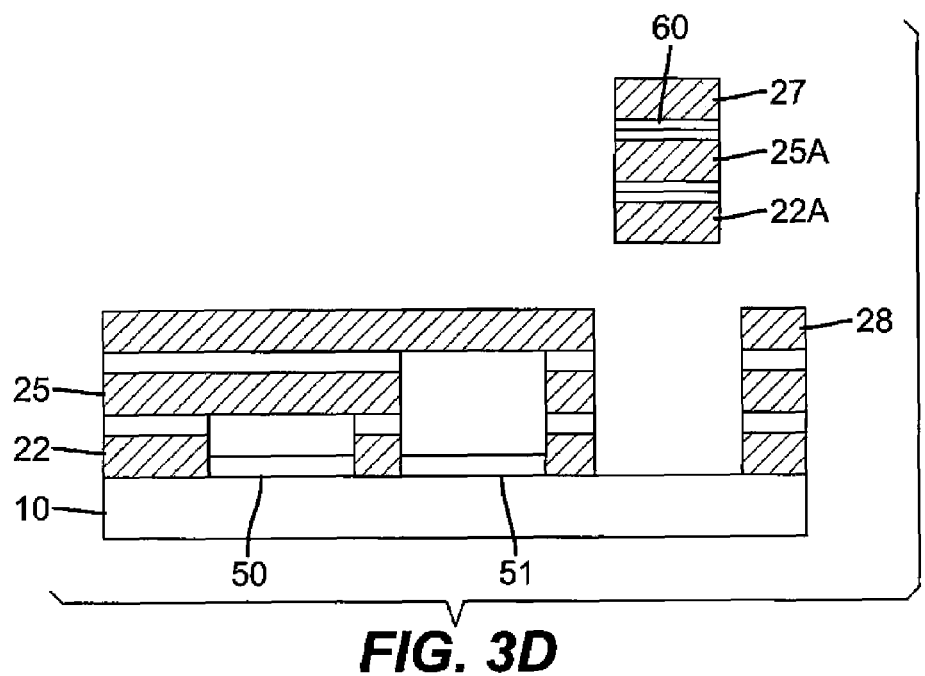
Figure 3E:
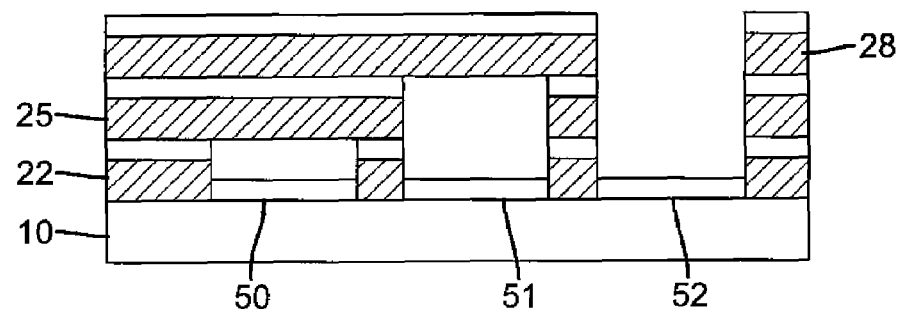
Figure 3F:
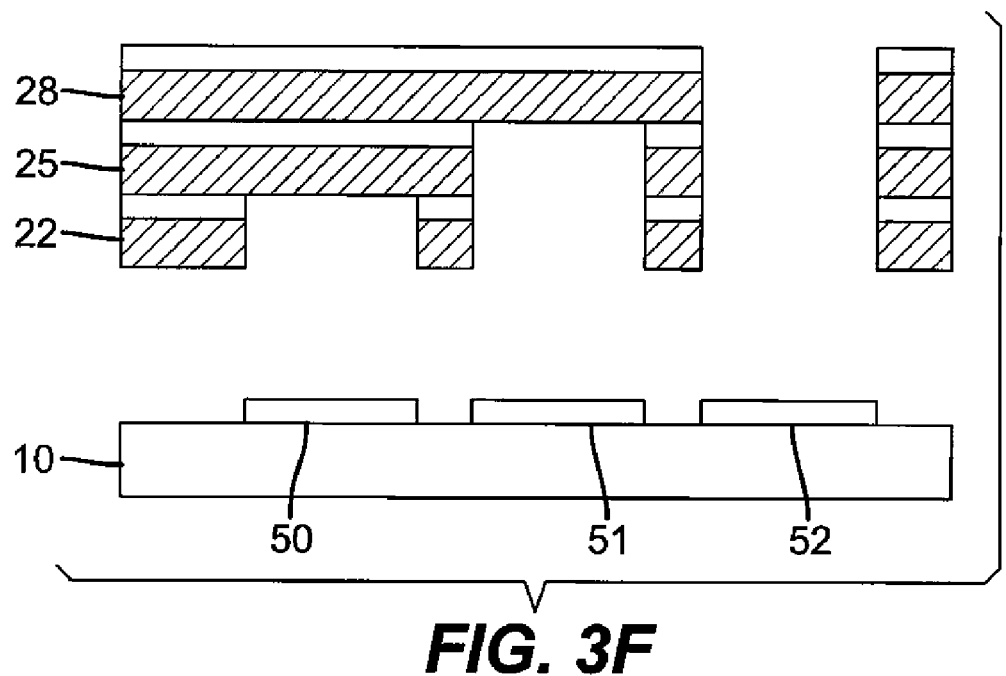

Referring to FIGS. 3A-3F, in a further embodiment of the present invention, another layer of materials may be deposited in another location over the substrate by repeating the steps shown in FIG. 2, before the first and second masking portions 22 and 25 are removed as shown in FIG. 2J. Referring to FIG. 3A, after the step illustrated in FIG. 2I, a third masking film 26 may be mechanically located over the second material 51 layer. The third masking film 26, the second masking portion 25A, and the first masking portion 22A may be segmented, for example with an ablating laser beam (FIG. 3B) to form a third masking portion 28 and third contiguous opening portion 27. A pattern-wise adhesive 60 may be activated (FIG. 3C) to adhere the third opening portion 28 to the second masking portion 25A and the first masking portion 22A, and mechanically removed (FIG. 3D). (The adhesive adhering the first and second masking portions 22A and 25A, respectively, may be activated before the third masking film 26 is located over the second material layer 51.) The frequency of the ablating beam of laser light may be different from the frequency of the light used to activate the controllable adhesive 60, to more carefully control the process of the present invention. A third material 52 layer may be deposited (FIG. 3E) and the first, second, and third masking portions 22, 25, 28 respectively, removed (FIG. 3F), leaving a patterned substrate 10 with three different materials deposited thereon. This process may be repeated to pattern further materials over the substrate.

Figure 5C:
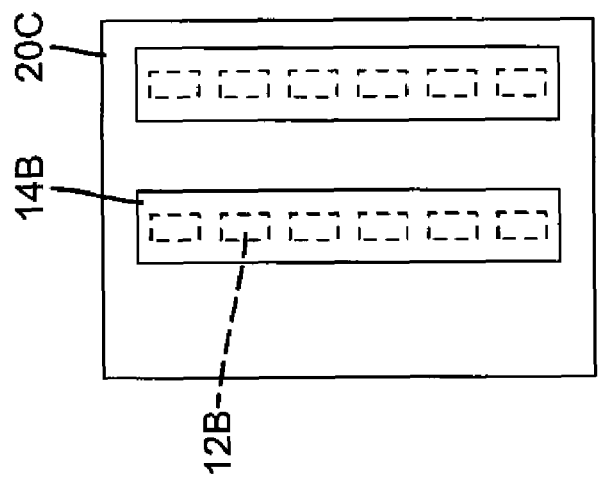
FIGS. 5A-C are top views of three different mask films with contiguous openings for depositing different materials on a substrate useful for the present invention.
Figure 5B:
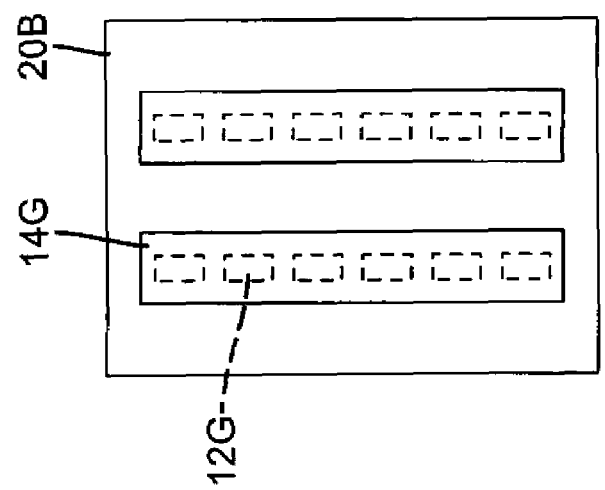
Figure 5A:
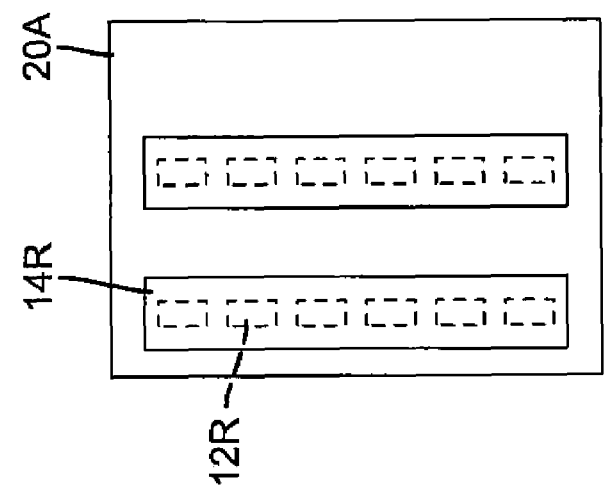

The deposited material 50, 51, 52 may be light-emitting materials that emit light of different colors in response to a current provided, for example by passive- or active-matrix circuitry as is known in the flat-panel display art. The circuitry may be employed to form patterned light-emitting areas over which the light-emitting materials are pattern-wise deposited. The pattern of mask holes 14R, 14G, 14B in the first, second, and third mask films 20A, 20B, 20C may be different (as shown in FIGS. 5A-5C) to expose different light-emitting areas and different light-emitting materials are typically deposited in the different areas. Hence, three different materials may be patterned in three different sets of light-emitting area locations (e.g. 12R, 12G, and 12B in FIGS. 4 and 5) over the substrate to form a plurality of full-color light-emitting pixels. Any remaining processing steps necessary to form a complete device may then be performed. For example, an OLED device using patterned OLED materials may be employed in either a top- or bottom-emitter configuration. Note that the present invention may be combined with the unpatterned deposition of other layers to form a complete light-emitting device. Such unpatterned materials may include charge-injection layers and charge-transport layers, for example as are known in the organic and inorganic LED arts. Alternatively, all of the layers may be patterned. Moreover, the areas of the mask holes 14 may be larger than the light-emitting areas 12 (as shown in FIGS. 4, 5, and 6). Since the light-emitting areas 12 are typically defined by patterned device electrodes (not shown), it is only necessary to deposit material over the electrode areas corresponding to light-emitting elements 12. Additional material may be deposited elsewhere to ensure that deposition tolerances are maintained.

Figure 7:
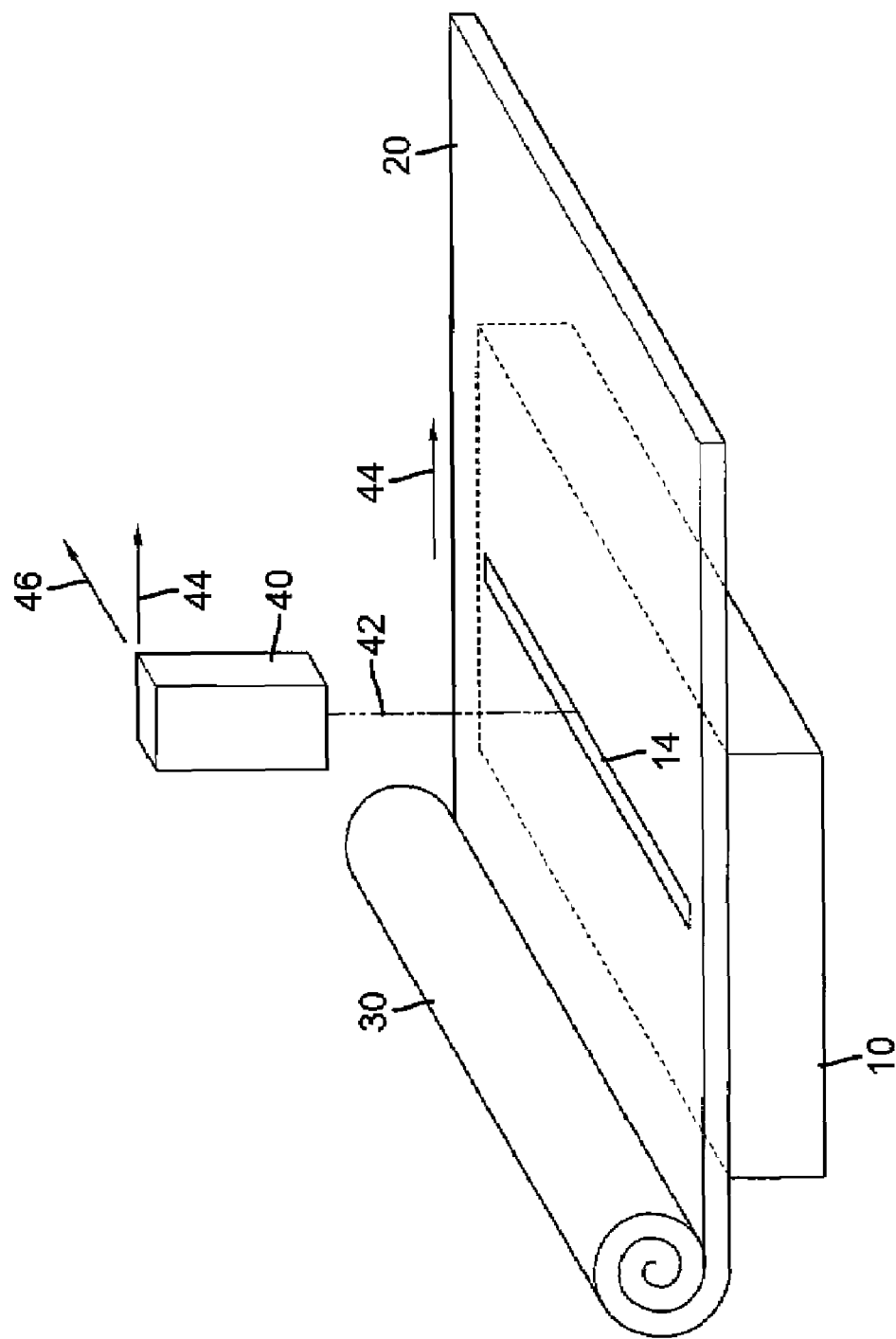
FIG. 7 is a perspective of a mask-film roll, mask film, material ablation device, and substrate useful for the present invention.
Figure 8:
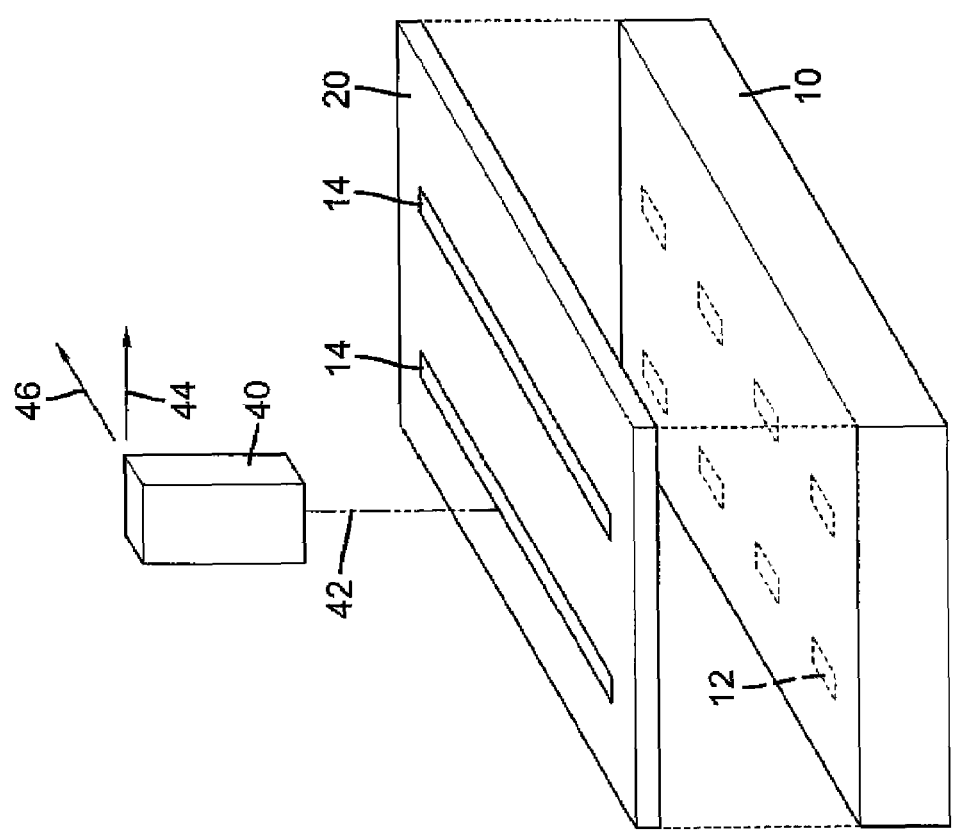
FIG. 8 is an exploded perspective of a mask film, material ablation device, and substrate useful for the present invention.

In one embodiment of the present invention, the contiguous opening portions may be segmented from the masking film by removing the mask film material from the perimeter of the contiguous openings in the masking film. This may be done by heating the masking film material, for example, by laser ablation, or by chemically treating the masking film. Referring to FIG. 7, a laser 40 emitting a beam of laser light 42 ablates the mask film 20 material in the perimeter of the mask hole openings 14 in masking film 20 over substrate 10. The beam of laser light 42 (or laser 40) is moved in orthogonal directions 44 and 46 to scan across the perimeter of the mask hole 14 and thereby ablate the material from the perimeter of mask hole 14. Alternatively, the substrate 10 may be moved in one direction while the beam of laser light 42 scans in the orthogonal direction, thereby enabling a continuous process. The masking film 20 may be dispensed from a roll 30 of masking film material and located over the substrate 10. Likewise, when the masking film 20 is removed, the mask film material may be mechanically picked up on a second roller (not shown) as new masking film material is advanced from the roller 30. Rolls of films, mechanisms for moving and locating the films over a substrate, lasers, and mechanisms for scanning lasers over a surface are all known in the art. FIG. 8 illustrates a more detailed exploded view including the laser 40, beam of laser light 42, the scan directions 44 and 46, the masking film 20 over the substrate 10, and a plurality of mask holes 14 located over light-emitting elements 12.

While the masking film 20 need not itself be registered with the light-emitting areas 12 on the substrate 10, the mask hole openings 14 may correspond with the light emitting areas 12 and also be registered with them. Such registration may be aided by providing, for example, fiducial marks on the substrate. Such marks and the mechanisms for scanning lasers and ablating material to a necessary tolerance are known in the art, as are devices for collecting ablated material. Typical light-emitting areas 12 may be, for example, 40 microns by 100 microns in size.

Figure 9:
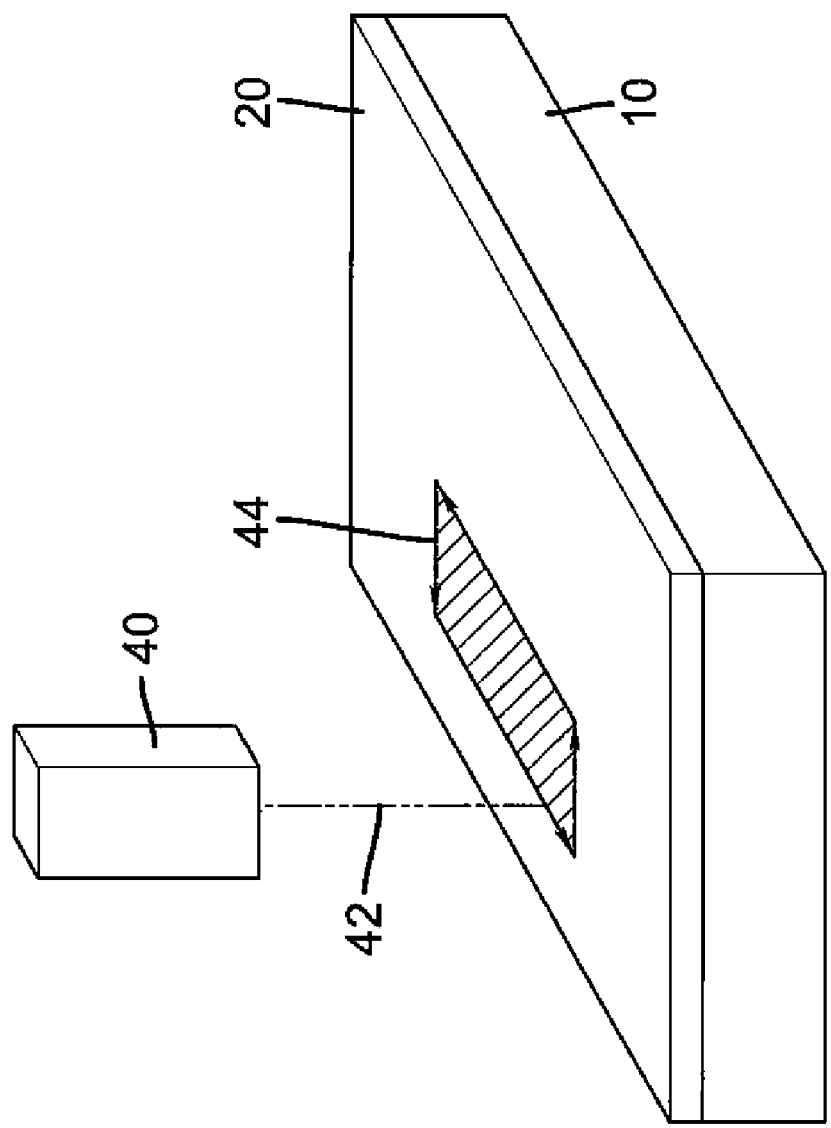
FIG. 9 is a perspective of a patterned mask film, material ablation device, and substrate useful for the present invention.
Figure 10:
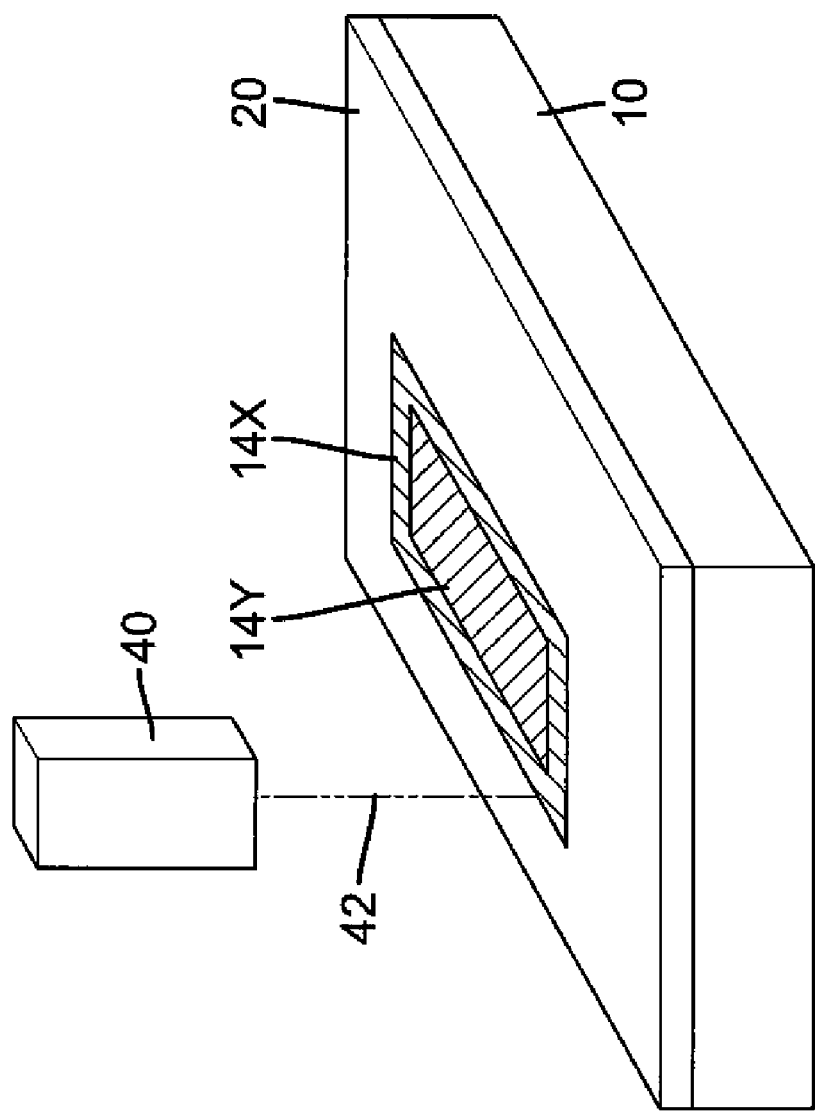
FIG. 10 is a perspective of a patterned mask film having an opening portion with a perimeter, a material deposition device, and substrate useful for the present invention.

In more detailed illustrations, referring to FIGS. 9 and 10, the laser 40 scans a beam of laser light 42 around the perimeter 14X of the mask hole 14Y so that the masking film material in the interior of the mask hole 14Y is mechanically detached from the masking film 20. The segmented masking film material 14Y within the perimeter 14X may then be mechanically removed, thereby leaving the mask hole opening 14Y free for subsequent deposition of light-emitting material.

Figure 11:
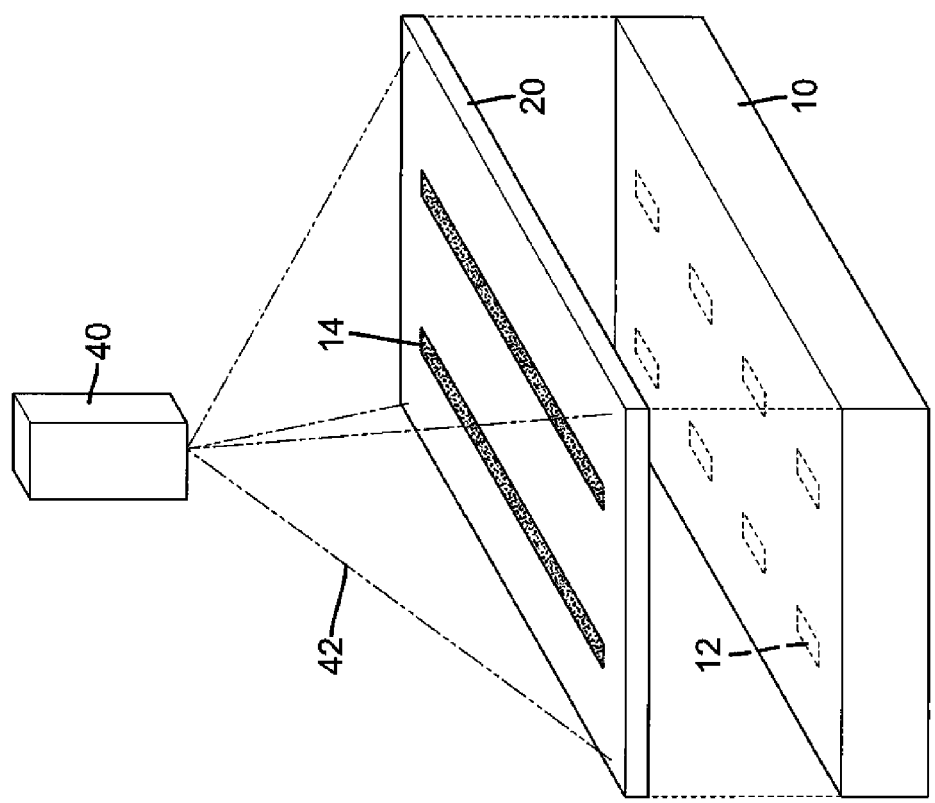
FIG. 11 is an exploded perspective of a patterned mask film, material ablation device, and substrate useful for the present invention.

While FIGS. 9 and 10 illustrate embodiments in which a beam of laser light 42 is moved over the masking film 20 to form mask hole openings 14, FIG. 11 illustrates an alternative approach. Referring to FIG. 11, the masking film 20 includes light absorptive areas adapted to selectively absorb laser light so that ablation only occurs in the light-absorptive areas. Light-absorptive areas, in the locations of the perimeter of the mask hole openings 14, may be formed by printing light-absorbing materials on the masking film 20, for example, by inkjet or gravure processes, before or after the masking film 20 is located over the substrate 10. The light-absorptive areas correspond to the perimeter of masking holes 14. In this way, the entire masking film 20 (or portions thereof) may be exposed at one time to ablate material in the light-absorptive areas, thereby increasing the amount of material that may be ablated in a time period and decreasing the amount of time necessary to form the mask hole openings 14 in the masking film 20.

Figure 12:
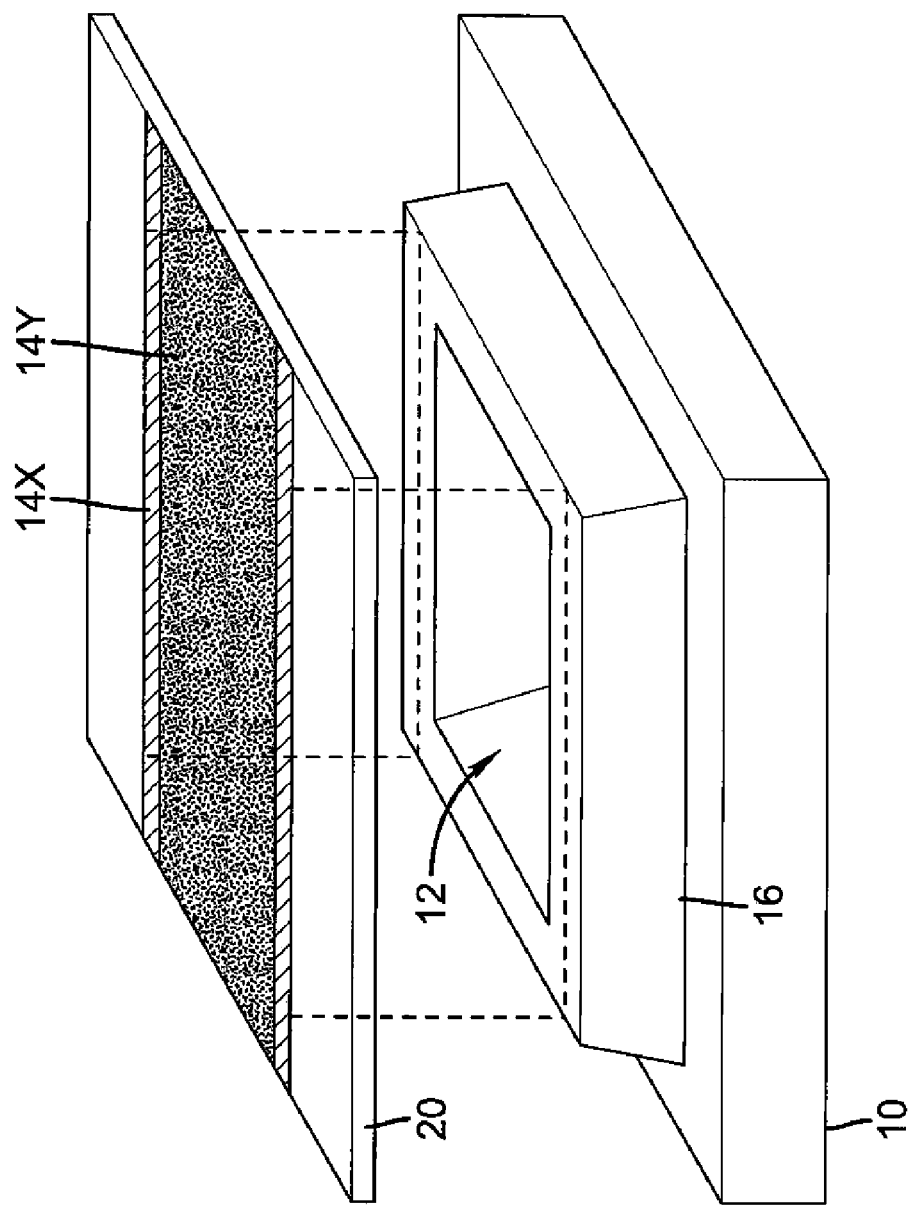
FIG. 12 is a three-dimensional view of a patterned mask film and a substrate with a raised area useful for the present invention.

Referring to FIG. 12, in a further embodiment of the present invention, raised areas 16 may be formed over the substrate 10. The raised areas 16 typically do not emit light and are inoperable. Such raised areas 16 can comprise, for example, photolithographic materials such as photo-resist or silicon dioxides or silicon nitrides formed on the substrate 10 through photolithographic processes and may be, for example, 20 microns to 50 microns wide, depending on the tolerances of the processes used to pattern the substrate electrodes or thin-film electronic components formed on the substrate. The raised areas 16 may be located around a light-emitting area 12 and may be employed to insulate electrodes formed over the substrate 10. Such processes are well known in the photolithographic art and have been employed in, for example, OLED devices. The masking film 20 may be located over the substrate 10 and in contact with the raised areas 16. Laser ablation may be performed to detach the mask hole material by ablating masking film material in a portion of the perimeter 14X of the mask hole 14. The remaining masking film material 14Y corresponding to the contiguous opening portion 14 is then detached. By employing a raised area 16, the masking film 20 is prevented from contacting the substrate 16 and any pre-existing layers located in the light-emitting areas 12.

As shown in FIG. 12, the mask hole perimeter 14X is located in part over the raised areas 16 (as shown by the dashed lines). In this embodiment, the beam of laser light 42 is not directed into the light-emitting element area 12, thereby avoiding any problems that might result from exposing existing layers of material that may be already present in the light-emitting areas 12 (for example, inadvertent ablation of pre-deposited organic materials). Note that the area of the mask hole 14 may be larger than the light-emitting area 12. The illustrations of FIG. 12 shows the substrate 10 below the masking film 20, however, the positions of the substrate 10 and masking film 20 may be reversed, so that detached materials may fall away from the masking film 20 to aid any mechanical removal.

Figure 13:
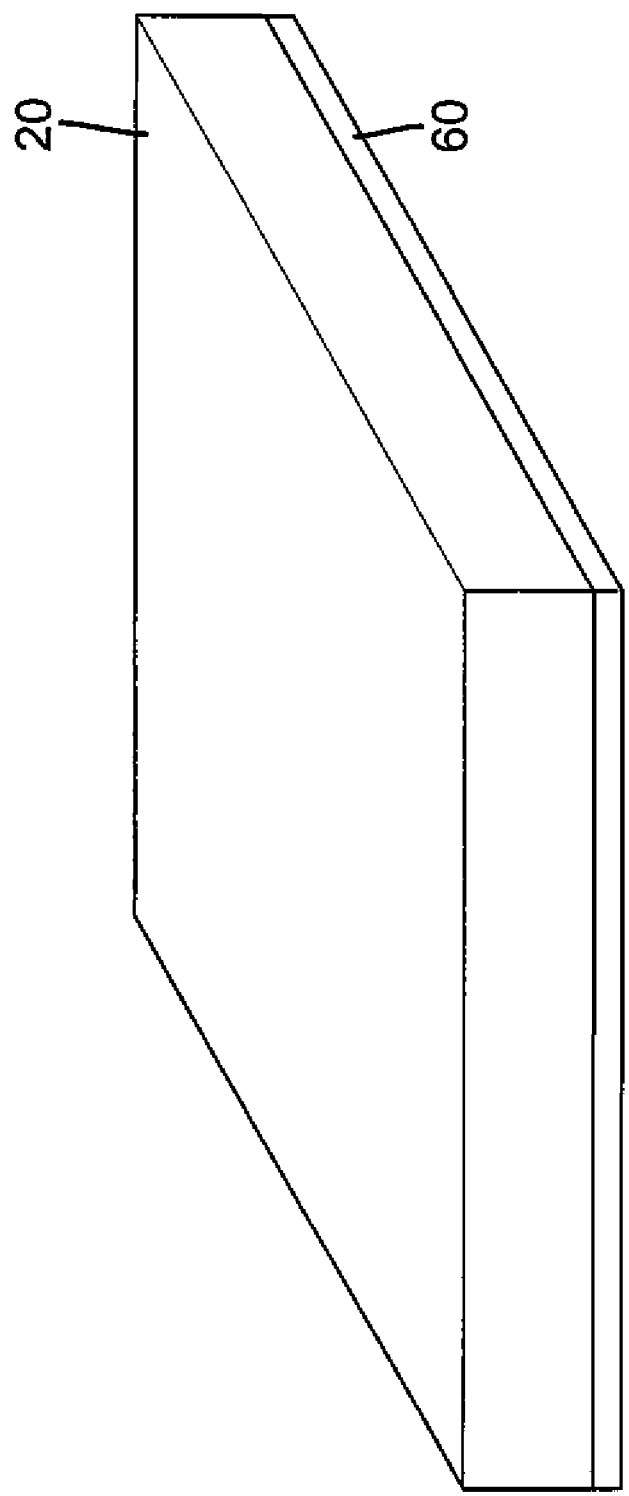
FIG. 13 is a three-dimensional view of a mask film having an adhesive layer useful for the present invention.

In further embodiments of the present invention as shown in FIG. 13, the masking film 20 may be coated with a weak adhesive 60 on one or both sides of the masking film 20 to assist in locating and maintaining the masking film 20 in registration with the substrate 10 and light-emitting areas 12. The adhesive may be located on the side of the masking film 20 that it is in contact with, and adjacent to, the substrate 10 or raised areas 16. The adhesive may prevent, for example, the masking film 20 from moving with respect to the substrate 10 and may also serve to prevent detached masking film material from moving or falling into the light-emitting area 12, or aid in mechanical removal, thus improving the mask film removal process. In another embodiment of the present invention, the adhesive may not be activated when the mask film 20 is applied over the raised areas 16. Pressure supplied from, for example a roller or plate, may be employed to adhere the mask film 20 to the raised areas 16. In an alternative embodiment, the adhesive may be pattern-wise light- or heat-curable, and light or heat is applied to the portions of the mask film in contact with the raised areas 20. The patterned adhesive has the advantage of reducing adhesion to other layers coated on the substrate, for example the light-emitting materials.

Figure 14:
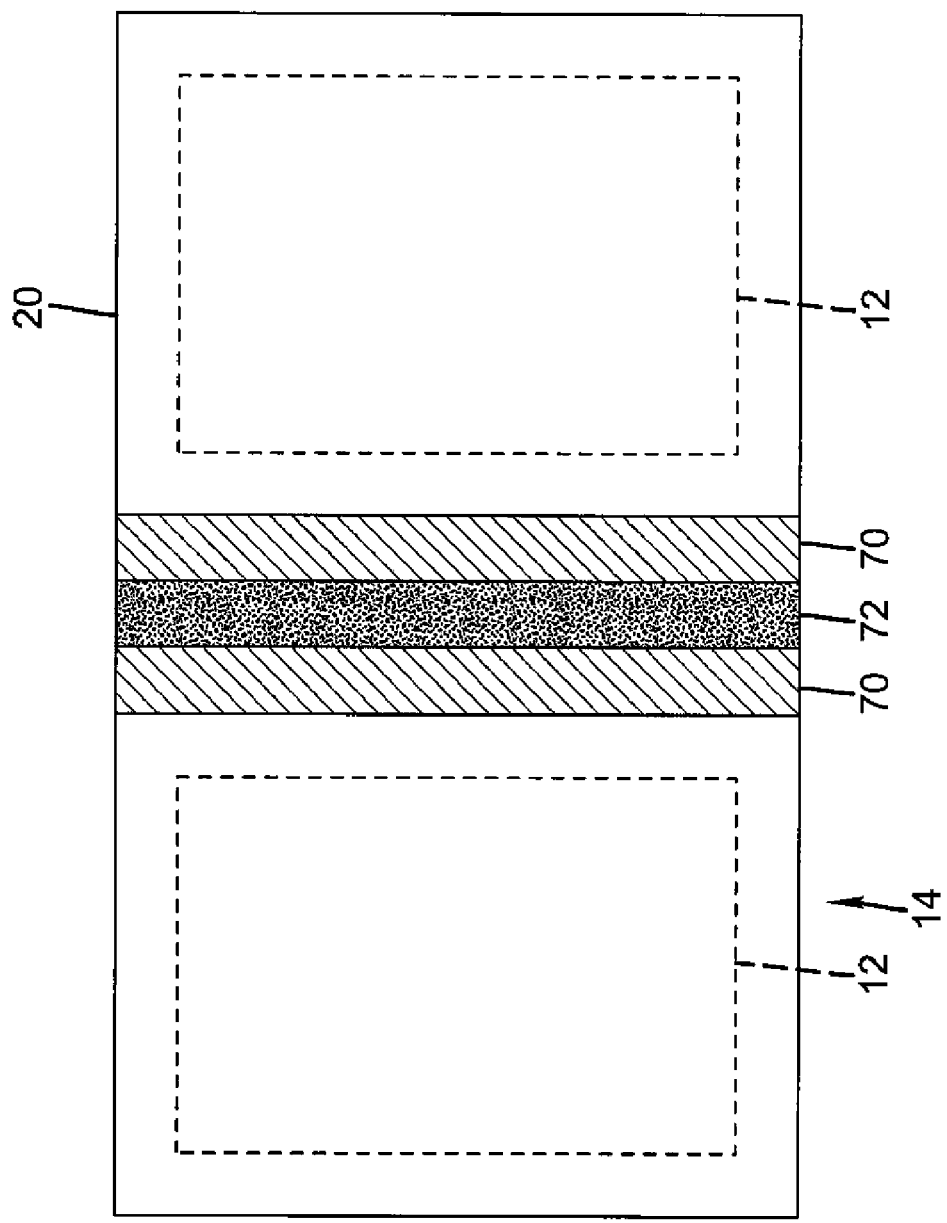
FIG. 14 is a top view of a light-emitting element, patterned adhesive area, and exposure path useful for the present invention.

In a further embodiment of the present invention, the pattern-wise-activated adhesive layer 21 may be activated in an area slightly larger than, and in registration with, the perimeter of the mask holes 14, so that the material at the edge of the holes may adhere to the raised areas 16, substrate 10, or layers coated on the substrate 10. Referring to FIG. 14, two adjacent light-emitting areas 12 are covered with mask film 20. Portions 70 of the mask film 20 are activated with adhesive to enable adhesion to the underlying surface between the light-emitting areas 12. The portion of the mask film material in a channel 72 is removed, for example, by ablation, so that the masking portion 22 of the mask film 20 may be segmented from the contiguous opening portion 14.

Figure 15:
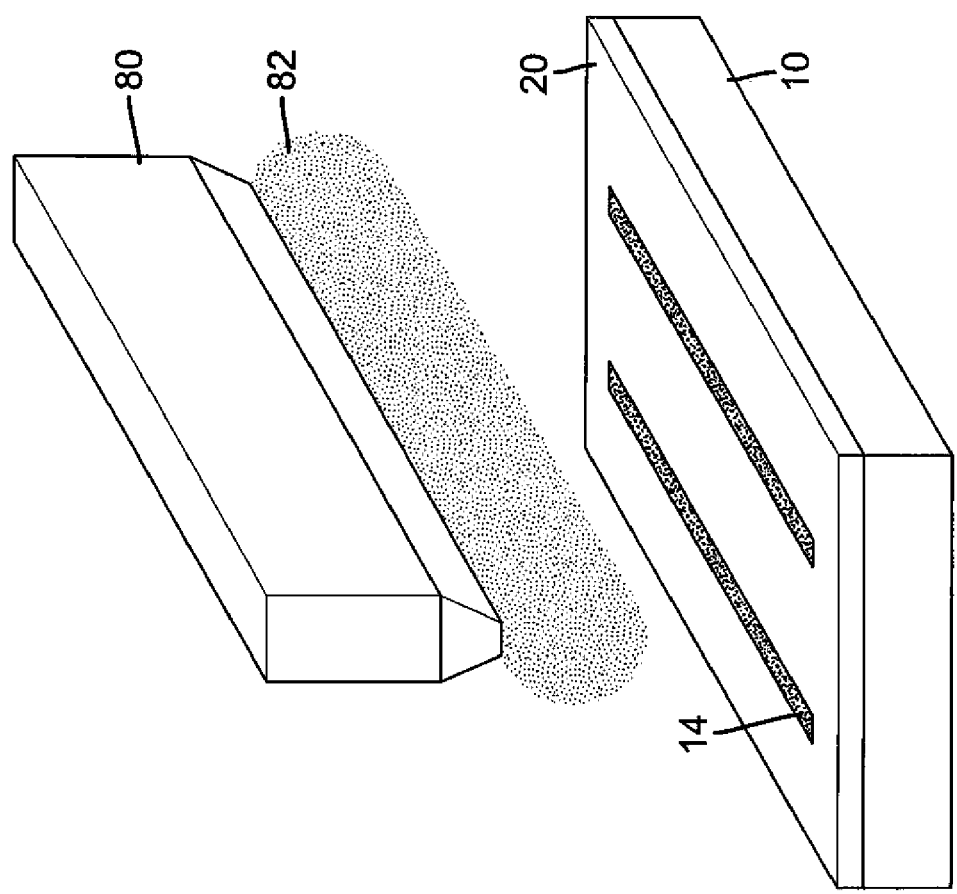
FIG. 15 is a three-dimensional view of a device for evaporating material through contiguous opening portions in a mask film useful for the present invention.

Referring to FIG. 15, once the mask hole openings 14 are formed in the masking film 20 in alignment with the light-emitting areas, light-emitting materials may be applied over the substrate through the mask hole 14. In the case of small-molecule OLED devices, the light-emitting materials are typically deposited by evaporation in a vacuum from a source, for example, a linear source 80 that forms a plume of organic material 82 that is deposited through the mask holes 14 onto the substrate 10 in the locations of the light-emitters 12.

Figure 16:
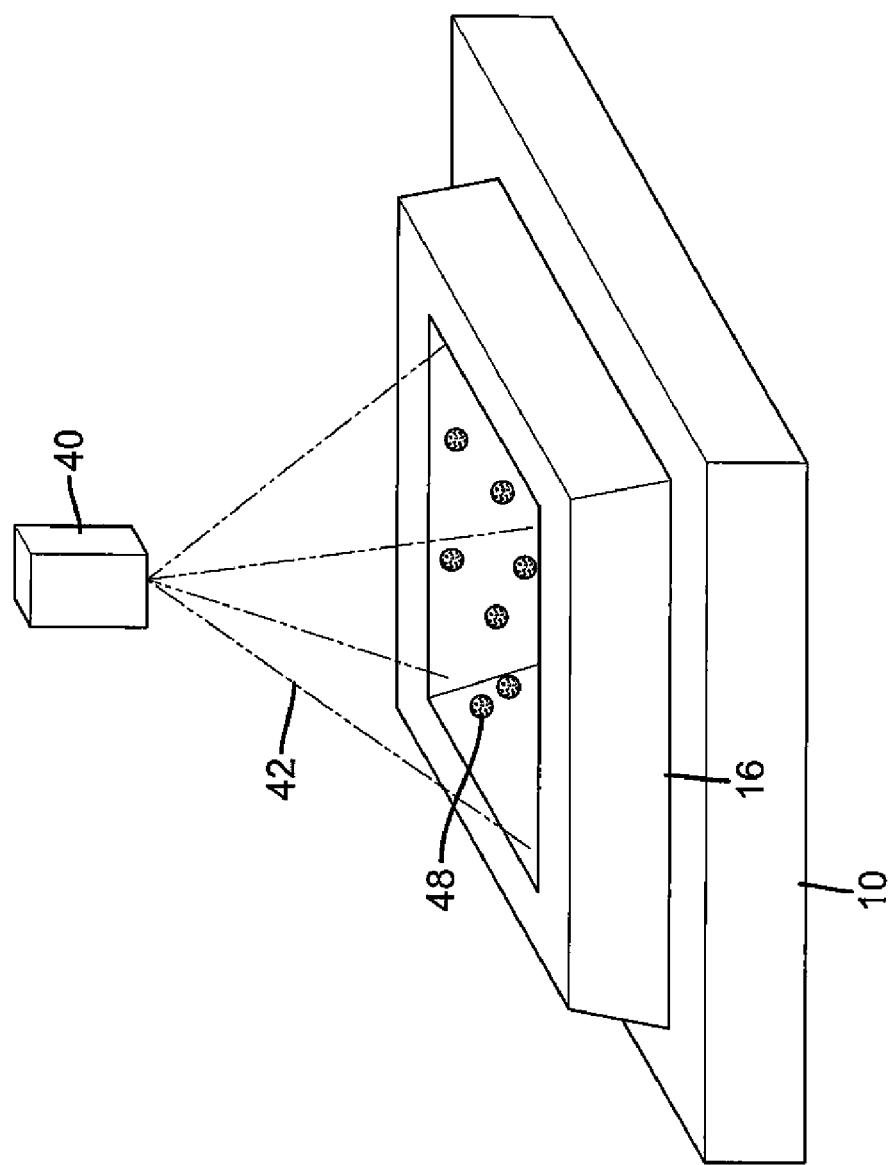
FIG. 16 is a three-dimensional view of contaminating particles within a light-emitting area, and an ablation device useful for the present invention.

Referring to FIG. 16, particulate contamination 48 deposited in the light-emitting areas 12 within a raised area 16 may be ablated as well, for example by a laser. Alternatively, plasma cleaning or other chemical or mechanical cleaning may be employed if only layers compatible with such cleaning processes are present.

Figure 17A:
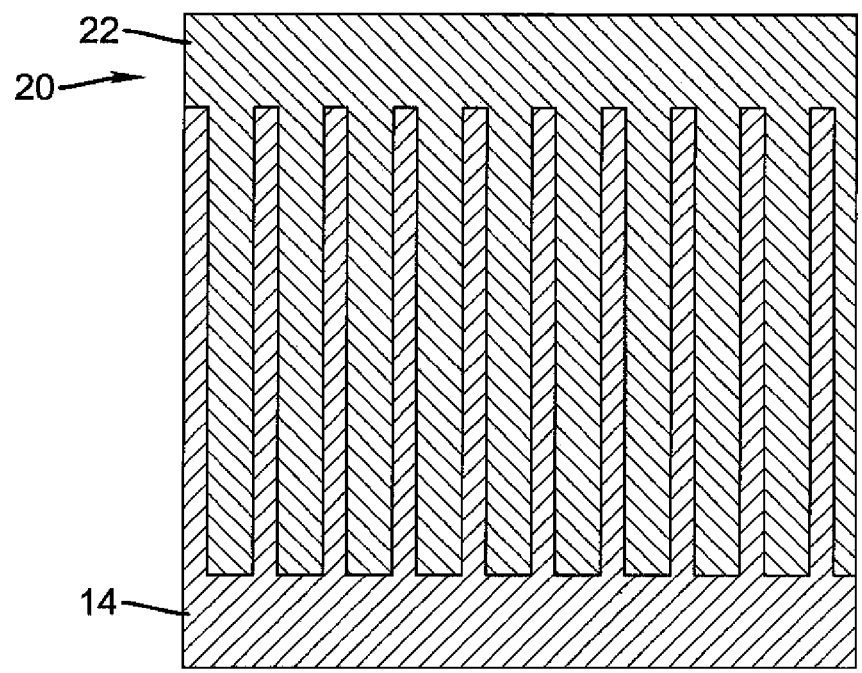
FIGS. 17A-17C are top views of a mask film and contiguous opening portions in a stripe pattern according to an embodiment of the present invention.
Figure 17B:
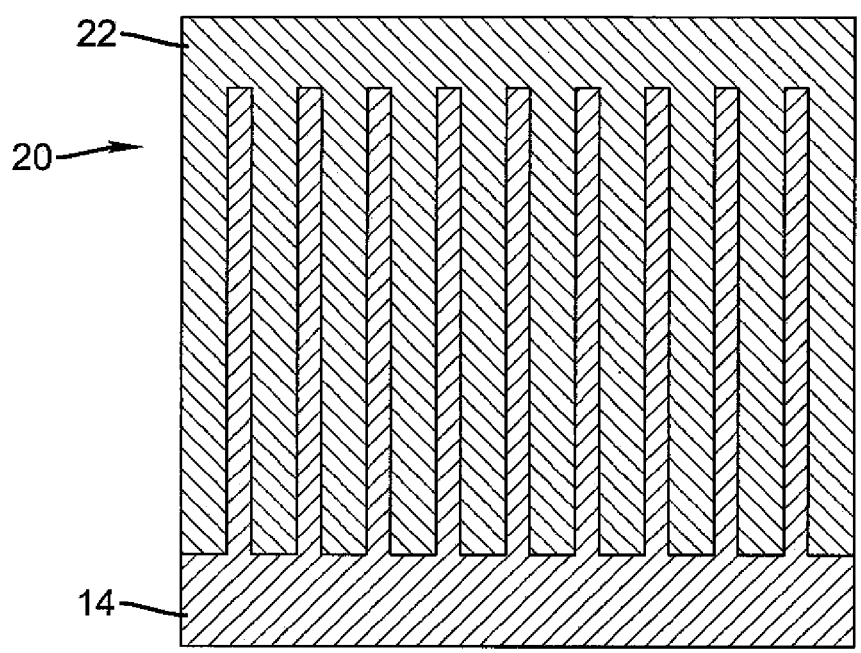
Figure 17C:
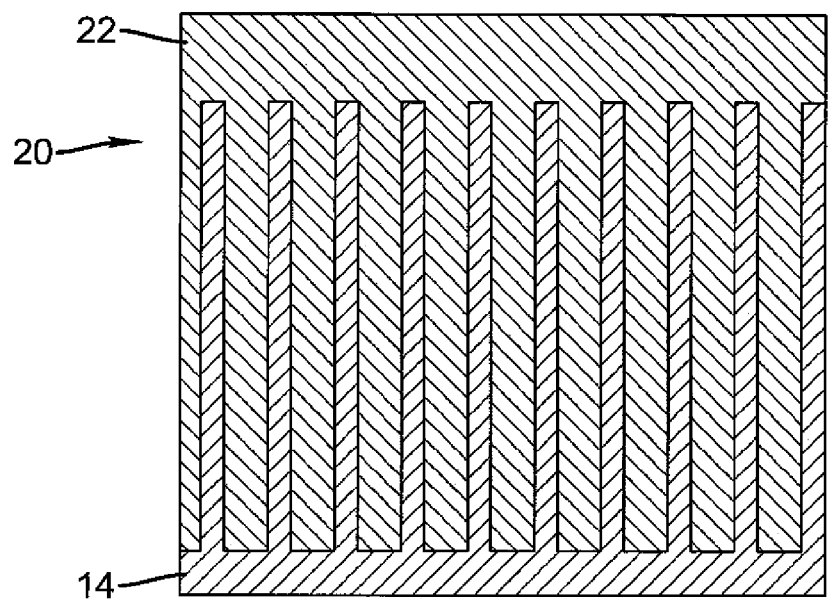

In further embodiments of the present invention, the contiguous opening portions 14 may all be connected to form a single contiguous opening portion while leaving the remaining masking portion as another contiguous component. Having two contiguous elements simplifies mechanical removal of the segmented portions. Referring to FIG. 17A, a mask film 20 has a contiguous opening portion 14. The contiguous opening portion 14 corresponds in location to a plurality of stripes of light-emitting areas, for example, as shown in FIG. 6. The stripes of the contiguous opening portion 14 are joined at one end of the stripes, while the remaining masking portion 22 is likewise joined at the other end to form two, segmented, pieces of mask film. By mechanically removing contiguous opening portion 14, for example, by grasping the joined end in a nip and pulling the joined end up and away from an underlying substrate, the entire contiguous opening portion 14 may be removed; thereby exposing the stripes of light-emitting elements 12 in one operational step and enabling the deposition of light-emitting materials. The remaining masking portion 22 may be likewise removed. Such an approach reduces particulate contamination, since the light-emitting areas 12 on which deposition of light-emitting materials is not intended, are covered during the deposition step and any particulate contamination resulting from ablation of mask film material for segmenting the contiguous opening portion will fall on the masking film 20 itself rather than into the light-emitting element areas 12. Moreover, mechanical removal of the masking portion or contiguous opening portion 14 is not likely to produce particulate contamination. Referring to FIGS. 17B and 17C, the contiguous opening portions of the mask film corresponding to different stripes of light-emitting elements in different locations are illustrated. As illustrated in FIG. 17A, the contiguous opening portion covers a single first column of pixels along the left edge of the masking film 20. In FIG. 17C, a single second column of pixels on the right of the first column of pixels is covered; while in FIG. 17B a single third column of pixels is covered.

Figure 18:
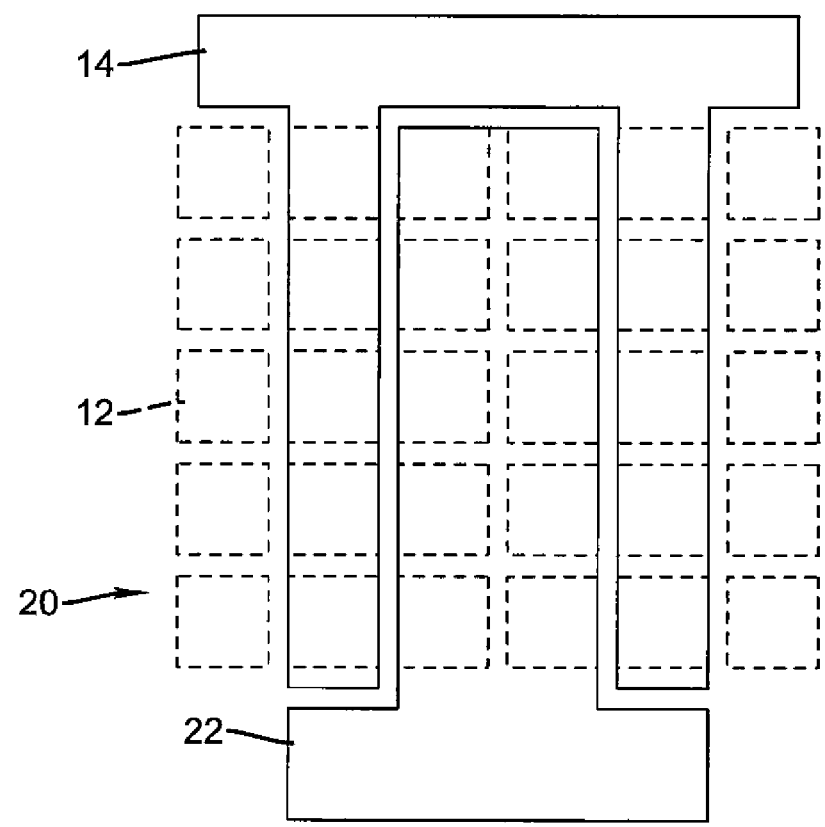
FIG. 18 is a top view of a mask film and contiguous opening portions in a stripe pattern of light-emitting elements according to an embodiment of the present invention.
Figure 19:
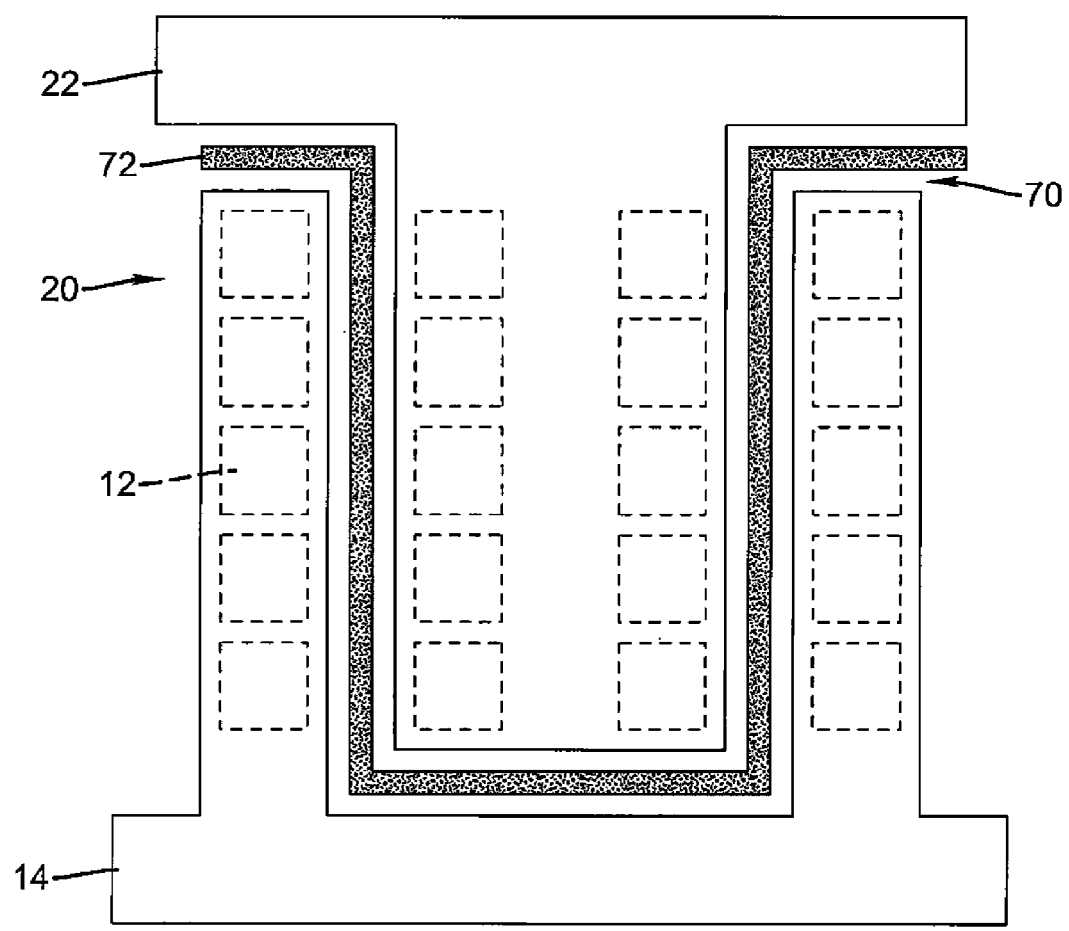
FIG. 19 is a top view of a mask film, contiguous opening portions and exposure path in a stripe of light-emitting elements according to an embodiment of the present invention.

FIG. 18 illustrates a method of the present invention in more detail. Referring to FIG. 18, light-emitting areas 12 are illustrated together with the mask film 20 and masking portion 22 covering two adjacent columns of light-emitting areas (for example red-light emitting and blue-light emitting areas), while the contiguous opening portion 14 covers two, non-adjacent stripes of light-emitting elements (for example green-light emitting). In a yet more detailed illustration of one embodiment of the present invention, FIG. 19 illustrates the path of an ablating beam of laser light employed to form a channel 72 to segment the masking portion 22 of the mask film 20 from the contiguous opening portion 14 and the underlying light-emitting elements 12. As discussed above, an adhesive, possibly patterned in an adhesive area 70, may also be employed. Note that in subsequent steps, the deposition areas may overlap each other so long as the light-emitting areas 12 are properly exposed or covered as the case may be. In such a case, light-emitting materials may be repeatedly deposited on non-light-emitting areas between the light-emitting areas 12. This arrangement may help the physical integrity of the contiguous opening portions 14.

The present invention provides many improvements over the prior art. The masking film may be inexpensive, for example, comprising for example PET (polyethylene teraphthalate) or other low-cost polymers provided in rolls. The film does not have to be repeatedly aligned with the substrate, as do traditional metal masks. Significant temperature dependencies may not arise, since the materials do not necessarily expand significantly in response to temperature; and if significant thermal expansion were to occur, the heat would only slightly decrease the area of the masking holes. If the masking holes were slightly oversized (as would be the case if a perimeter was ablated over a raised area), no effect on the formation of the light-emitting area would result. Because the film covers all of the substrate, except those areas to be patterned with light-emitting materials, the substrate is protected from particulate contamination. Moreover, because a new film is provided for each deposition cycle, particulate contamination formed by removing masking film material may be removed when the masking film is mechanically removed. Employing a raised area around the light-emitting areas likewise prevents damage to any pre-existing light-emitting areas, as does ablating a perimeter over the raised areas around mask holes. In any case, the masking film may be sufficiently thin that touching any delicate layers of, for example, organic materials, on the substrate may not damage the layers.

The present invention also provides a scalable means for manufacturing patterned light-emitting devices, since the masking film can be readily made in large sizes. Laser systems useful for ablating masking film materials may comprise many separate lasers, therefore enabling fast patterning. Such laser systems are known in the art. Mechanical removal of the mask film material enables fast turnaround on arbitrarily large substrates. The present invention can be employed in continuous processing systems.

The method of the present invention also finds application in the fabrication of other kinds of photonic and electronic devices, such as reflective and transmissive color displays where several materials used to construct the pixels require separate masks. This is particularly true in the case of color devices that generally require three separate colored materials to be patterned differently. Typically these devices also require a transparent conductor such as indium-tin-oxide, which may be deposited by sputtering and is conveniently patterned by one mask step using the present invention. Active-matrix displays, thin film transistors (TFTs), and capacitors may be fabricated for an active-matrix pixel. The TFT's gate dielectric and semiconductor layers typically require separate masks. Metal tracks may also be conveniently patterned by the present invention, and again will require a separate mask or masks. Other photonic devices such as photodetectors, photovoltaic cells, and optical waveguide structures may also be fabricated using the method of the present invention.

The present invention may be practiced with either active- or passive-matrix organic or inorganic LED devices. It may also be employed in display devices or in area illumination devices. In one embodiment, the present invention is employed in a flat-panel OLED device composed of small molecule or polymeric OLEDs, as disclosed in, but not limited to U.S. Pat. No. 4,769,292, issued Sep. 6, 1988 to Tang et al.; and U.S. Pat. No. 5,061,569, issued Oct. 29, 1991 to VanSlyke et al. Many combinations and variations of organic light-emitting displays can be used to fabricate such a device, including both active- and passive-matrix OLED displays having either a top- or bottom-emitter architecture. Inorganic or polymer light-emitting materials may also be employed and patterned according to the method of the present invention.

The invention has been described in detail with particular reference to certain preferred embodiments thereof, but it will be understood that variations and modifications can be effected within the spirit and scope of the invention.

| PARTS LIST | |
|---|---|
| 10 | substrate |
| 11 | pixel |
| 12 | light-emitting area or element |
| 12R | red light-emitting area |
| 12G | green light-emitting area |
| 12B | blue light-emitting area |
| 12X | non light-emitting area |
| 14 | mask hole, contiguous opening portion |
| 14R | opening in masking film for red light-emitter |
| 14G | opening in masking film for green light-emitter |
| 14B | opening in masking film for blue light-emitter |
| 14X | mask hole perimeter |
| 14Y | mask hole material within perimeter of mask hole |
| 16 | raised area |
| 20, 20A, 20B, 20C | masking film |
| 21 | contiguous opening portion |
| 22, 22A | masking portion |
| 23 | second masking film |
| 24 | second opening portion |
| 25, 25A | second masking portion |
| 26 | third masking film |
| 27 | third contiguous opening portion |
| 28 | third masking portion |
| 30 | roll of masking film |
| 40 | laser |
| 42 | beam of light |
| 44, 46 | direction |
| 48 | contaminating particles |
| 50 | first materials |
| 51 | second materials |
| 52 | third materials |
| 60 | pattern-wise controllable adhesive |
| 70 | patterned adhesive area |
| 72 | channel |
| 80 | linear source |
| 82 | plume of evaporated particles |
| 100 | locate first masking film step |
| 105 | segment first masking film step |
| 110 | mechanically remove first contiguous opening portions step |
| 115 | deposit first materials step |
| 120 | mechanically locate second masking film step |
| 125 | segment second masking film step |
| 130 | mechanically remove second contiguous opening portions step |
| 135 | deposit second materials step |
| 140 | remove masking portions step |

The invention claimed is:

1. A method of patterning a substrate, comprising:
a) providing a separately formed first masking film and then mechanically placing the first masking film over the substrate;
b) segmenting the first masking film into at least two separate detached masking film portions, a first masking portion and one or more first opening portions in first locations, each first location covering two or more different, non-contiguous operable areas and at least one inoperable area over the substrate;
c) mechanically peeling the one or more first opening portions intact from the substrate to thereby expose each of the first locations;
d) depositing first materials over the substrate in the first locations to form first patterned areas;
e) providing a separately formed second masking film and then mechanically locating the second masking film over the substrate and first masking portions;
f) segmenting the second masking film and first masking portion into at least two separate detached masking film portions, a second masking portion and one or more second opening portions, wherein the second opening portions are in one or more second locations over the substrate, yet different from the first locations, each second location covering two or more different, non-contiguous operable areas and at least one inoperable area over the substrate;

g) mechanically peeling the one or more second opening portions intact from the substrate to thereby expose each of the second locations; and h) depositing second materials over the substrate in the second locations to form second patterned areas.

2. The method of claim 1, further comprising mechanically removing the second masking portion after the second materials are deposited.

3. The method of claim 1, further comprising:

i) mechanically locating a third masking film over the substrate and second masking portions;

j) segmenting the third masking film and second masking portion into a third masking portion and one or more third contiguous opening portions, wherein the third contiguous opening portions are in one or more third locations over the substrate different from the first and second locations;

k) mechanically removing the one or more third contiguous opening portions; and l) depositing third materials over the substrate in the third locations to form third patterned areas.

4. The method of claim 3, further comprising mechanically removing the third masking portion after the third materials are deposited.

5. The method of claim 1, wherein the first and second materials are light-emitting materials and the patterned areas are light-emitting areas.

6. The method of claim 1, wherein the second masking film is adhered to the first masking portions in one or more locations of the second contiguous openings.

7. The method of claim 1, wherein a pattern-wise controllable adhesive layer is formed on a surface of the first or second masking films.

8. The method of claim 7, wherein the first or second masking film is transparent.

9. The method of claim 7, wherein the first or second masking film or the adhesive layer is light absorbing.

10. The method of claim 7, wherein the pattern-wise controllable adhesive layer is controlled by patterned heating or exposure to radiation.

11. The method of claim 7, wherein the pattern-wise controllable adhesive layer is controlled by exposure to laser radiation.

12. The method of claim 7, wherein the pattern-wise controllable adhesive layer is controlled by exposure to a first frequency of light and the first masking film is segmented by exposure to a second frequency of light.

13. The method of claim 1, wherein the first or second patterned areas include a plurality of operable and inoperable portions, and the operable portions are separated from each other by the inoperable portions.

14. The method of claim 13, further comprising segmenting the first masking film in the inoperable portions.

15. The method of claim 13, further comprising forming raised areas in the inoperable portions.

16. The method of claim 1, wherein the first or second masking film is segmented by exposure to laser light.

17. The method of claim 1, wherein the step of depositing the first and second materials includes evaporating, spray coating, slide coating, hopper coating, or curtain coating materials over the substrate in the first locations.

18. The method of claim 1, wherein the first and second materials are organic materials including small-molecule or polymer molecule light-emitting diode materials or inorganic light emitting particles.

19. The method of claim 1, wherein the areas form a striped pattern and the first and second materials in the stripe emit light of the same color.

20. The method of claim 19, wherein the first opening portion forms a plurality of separated stripes, and wherein the separated stripes rejoined at one end of the stripes.

* * * * *